United States Patent [19]

Richardson et al.

[11] Patent Number: 5,270,643
[45] Date of Patent: Dec. 14, 1993

[54] PULSED LASER PHOTOEMISSION ELECTRON-BEAM PROBE

[75] Inventors: Neil Richardson, Stamford, Conn.; Kenneth R. Wilsher, Palo Alto, Calif.

[73] Assignee: Schlumberger Technologies, San Jose, Calif.

[21] Appl. No.: 928,919

[22] Filed: Aug. 12, 1992

Related U.S. Application Data

[63] Continuation-in-part of Ser. No. 619,927, Nov. 28, 1990, abandoned.

[51] Int. Cl.$^5$ ............................................. G01R 27/26
[52] U.S. Cl. ................................ 324/158 R; 324/73.1; 324/96
[58] Field of Search ............... 324/158 R, 73.1, 96, 324/158 P; 371/15.1, 25.1; 250/310, 311, 493.1, 492.1, 492.2, 492.3; 356/364, 401, 367

[56] References Cited

U.S. PATENT DOCUMENTS

| | | | |
|---|---|---|---|
| 3,796,947 | 3/1974 | Harrod et al. | 324/158 P |
| 4,862,075 | 8/1989 | Choi et al. | 324/158 R |
| 4,875,006 | 10/1989 | Henley et al. | 324/158 R |
| 4,963,823 | 10/1990 | Otto et al. | |
| 5,095,262 | 3/1992 | Henley et al. | 324/158 R |
| 5,157,327 | 10/1992 | Henley | 324/158 R |
| 5,170,127 | 12/1992 | Henley | 324/158 R |

FOREIGN PATENT DOCUMENTS

| | | |
|---|---|---|
| 0348785 | 1/1990 | European Pat. Off. |
| 0357440 | 3/1990 | European Pat. Off. |
| 9002955 | 3/1990 | PCT Int'l Appl. |

OTHER PUBLICATIONS

M. Brunner et al., Non-Invasive Waveform Measurements of IC-Internal GHz Signals in a ps Time Scale, Microelectronic Engineering, vol. 9, Nos. 1-4, May 1989, Amsterdam, NL, pp. 405-410.

R. Schmitt et al., Applications of High-Speed Electron-Beam Testing in Solid State Electronics, Microelectronic Engineering, vol. 12, Nos. 1-4, May 1990, Amsterdam, NL, pp. 279-286.

P. May et al., Picosecond photoelectron microscope for high-speed testing of integrated circuits, IBM Journal of Research and Development, vol. 34, No. 2/3, Mar.-/May 1990, Armonk, N.Y., pp. 204-214.

K. Weingarten et al, Picosecond Optical Sampling of GaAs Integrated Circuits, IEEE Journal of Quantum Electronics, vol. 24, No. 2, Feb. 1988, New York, N.Y., pp. 198-220.

Primary Examiner—Vinh Nguyen
Attorney, Agent, or Firm—Kenneth Olsen; Keith G. W. Smith; Bruce D. Riter

[57] ABSTRACT

An electron-beam test probe system (400) in which a pulsed laser-beam source (404) and a photocathode assembly (430) are used with an electron-beam column (426) to produce a pulsed electron beam at a stabilized repetition frequency. A pulse picker (414) allows the pulse repetition frequency of the pulsed electron beam to be reduced to a submultiple of the pulsed laser repetition frequency. A test pattern generator (416) is programmable to apply a desired pattern of test vector patterns to an electronic circuit to be probed, the test vector patterns being synchronized with the stabilized laser-beam pulse repetition frequency. A timebase circuit (412) allows the test vector patterns to be time-shifted relative to the pulsed electron beam. The electronic circuit under test can thus be probed at any desired point in the applied test vector pattern by control of the pulse picker and by time-shifting the test vector pattern.

36 Claims, 18 Drawing Sheets

PULSED LASER PHOTOEMISSION ELECTRON-BEAM PROBE

This is a continuation-in-part of application Ser. No. 07/619,927, filed Nov. 28, 1990, (now abandoned) the content of which is incorporated herein by this reference.

BACKGROUND OF THE INVENTION

1. Field of the Invention

The present invention relates to electron-beam probing methods and systems useful, for example, in analyzing operation of Very Large Scale Integrated (VLSI) circuit devices. In particular, the present invention relates to electron-beam probing methods and systems in which test patterns generated to exercise a device are synchronized with pulsed-laser photoemission of an electron probe beam.

2. The Prior Art

Characterizing and verifying the operation of VLSI circuit devices is an important element of their design. Probing internal nodes of such devices plays an increasingly significant role in this process.

The recent development of electron-beam (E-beam) probe tools and techniques has greatly assisted in overcoming the problems involved in probing internal nodes of integrated circuits. E-beam probing uses the principle of voltage contrast in a scanning electron microscope (SEM) to perform VLSI diagnosis through non-contact electron-beam measurement of internal signals in a VLSI device. A focused beam of primary electrons is directed toward a conductor within a circuit specimen as signals are applied to the specimen. Detected secondary electrons are indicative of the surface electrical potential on conductors within the specimen. See, for example, E. Menzel & E. Kubalek, *Fundamentals of Electron Beam Testing of Integrated Circuits*, 5 SCANNING 103-122 (1983), and E. Plies & J. Otto, *Voltage Measurement Inside Integrated Circuit Using Mechanical and Electron Probes*, IV SCANNING ELECTRON MICROSCOPY 1491-1500 (1985).

Commercial introduction by Schlumberger in 1987 of the "IDS 5000 TM" workstation-based, electron-beam test probe system greatly simplified E-beam probing of circuit chips and increased the efficiency of circuit debug. See S. Concina, G. Liu, L. Lattanzi, S. Reyfman & N. Richardson, *Software Integration in a Workstation Based E-Beam Tester*, INTERNATIONAL TEST CONFERENCE PROCEEDINGS (1986); N. Richardson, *E-Beam Probing for VLSI Circuit Debug*, VLSI SYSTEMS DESIGN (1987); S. Concina & N. Richardson *IDS 5000: an Integrated Diagnosis System for VLSI*, 7 MICROELECTRONIC ENGINEERING (1987); and see U.S. Pat. Nos. 4,706,019 and 4,721,909 to N. Richardson, which are incorporated herein by reference. See also J. FROSIEN, et al., *High Performance Electron Optical Column for Testing ICs with Submicrometer Design Rules*, MICROELECTRON. ENG. (NETHERLANDS), vol. 7., no. 2-4, pp. 163-72 (First European Conference on Electron and Optical Beam Testing of Integrated Circuits, Grenoble, France, Dec. 9-11, 1987).

FIG. 1 is a block diagram of a prior art electron-beam test probe system 110. The system has three main functional elements: an electron-beam test probe 112, a circuit exerciser 114, and a data processing system 116 which includes a display terminal 118. The circuit exerciser 114 may be a conventional integrated circuit tester, such as a model "S 15 TM" tester available from Schlumberger Technologies of San Jose, Calif., which can repeatedly apply a pattern of test vectors to the specimen circuit over a bus 124. The specimen circuit (device under test, or DUT) 126 is placed in a vacuum chamber 128 of the electron-beam test probe 112 so that potential measurements can be made as the test vector pattern is applied. The points at which such measurements are to be made are sent to the electron-beam test probe 112 by the data processing system 116 over a bus 122. The data processing system 116 may also be used to specify the test signal pattern used and the timing of the potential measurements relative to the test signal pattern. The electron-beam test probe system is controlled by an operator who inputs commands through the display terminal 118.

SEMs used for electron-beam probing, such as that in the IDS 5000 system, are equipped with high-speed beam pulsing hardware sometimes referred to as a "beam-blanker." An example of such hardware is described in U.S. Pat. No. 4,721,909. Directing a pulsed electron beam at a particular node of interest provides a mode of operation much like that of a sampling oscilloscope, in which images can be produced of waveforms at one or more nodes in the specimen circuit as test vector patterns are applied to the specimen circuit.

For each point of the waveform image, a measurement is made by pulsing the electron beam at a specific time during application of the test vector pattern to the specimen circuit. Since the time needed to make a potential measurement is generally longer than the time over which the test signal pattern remains constant, stroboscopic techniques are used. That is, the electron beam is turned on for a brief period of time at a point in the test signal pattern. Each time the electron beam is so pulsed, a measurement of the potential on a node of the specimen circuit is made.

Since a single measurement has insufficient statistical accuracy to allow an accurate determination of the potential, measurements made over many repetitions of the test vector pattern are averaged. For even a relatively simple circuit under test, tens of thousands or even hundreds of thousands of repetitions of the test vector pattern may be needed to acquire the data represented in a waveform image. Coordination of the electron-beam pulses with the test vector pattern may be effected by a trigger generator circuit of the electron-beam test probe system under control of data processing system 116.

New design and process technologies result in ever-faster VLSI circuit devices having internal elements with decreased switching transition times. Device characterization and verification thus become increasingly difficult. Conventional electron-beam probe systems of the kind described above have at least two limitations which become critical as switching transition times of VLSI circuit devices decrease.

First, the electron source brightness obtained with the conventionally-used tungsten or lanthanum hexaboride thermionic emitters is low; at the necessarily low beam accelerating voltage of around 1 kV, the amount of peak current in the final electron probe is limited to about 1 nA when the probe diameter is around 0.1 micron. When the beam is pulsed with a duration of less than 50 ps (picoseconds) in order to perform high speed sampling measurements, the statistical average number of electrons per pulse is less than one. This leads to intractable signal processing problems and intolerably long signal integration times. For example, as the duty cycle (the trigger period divided by the beam pulse width) increases, leakage currents and other measurement limitations result in degraded measurement accuracy. Data acquisition time is a real concern, particularly with the lengthy test vector patterns require to exercise ever more complex integrated circuits. Second, and because of the relatively low beam accelerating voltage, the construction of an effective beam pulser/blanker to produce pulses of duration much less than 50 ps is extremely difficult, and may be a practical impossibility in a commercial machine. Thus, even with a brighter source than those mentioned above, routinely generating pulses of less than 50 ps would still be difficult. Though brighter sources such as thermal field emitters are known (see, for example, L. SWANSON, *A Comparison of Schottky and Cold Field Emission Cathodes* (FEI Company, Beaverton, Oreg., January 1989), they are not routinely used because of the extremely stringent requirements on the operating vacuum pressure around the source.

Work done at the IBM Watson Research Center, Yorktown Heights, N.Y., shows that it is possible, with a laser stimulated photocathode, to extend the performance of an electron beam prober to the point where beam pulses can be generated which are of less than 2 ps duration and which have more than 2000 electrons per pulse. See, for example, P. MAY, et al., *Picosecond photoelectron scanning electron microscope for noncontact testing of integrated circuits*, APPL. PHYS. LETT. 51 (2), pp. 145-147 (1987); P. MAY, et al., *Noncontact High Speed Waveform Measurements with the Picosecond Photoelectron Scanning Electron Microscope*, IEEE J. QUANTUM ELECTRON. (USA), Vol 24., No. 2, pp. 234-239 (February 1988); J-M. HALBOUT, et al., *SRAM Acess Measurements Using a Picosecond Photoelectron Scanning Electron Microscope*, Paper No. WPM 8.2, IEEE International Solid State Circuits Conference (ISSCC, 1988); P. MAY, et al., *Waveform Measurements in High Speed Silicon Bipolar Circuits Using a Picosecond Photoelectron Scanning Electron Microscope*, IEEE International Electron Devices Meeting (IEDM, 1987). pp. 92 et seq.

While a pulsed-laser photoemission source offers a dramatically brighter source of short-duration electron-beam pulses (on the order of $10^1$ electrons per pulse vs. $10^{-2}$ electrons per pulse with typical thermionic sources), the pulsed-laser electron-beam cannot be readily turned on and off in response to trigger pulses from the test pattern generator in the manner employed with thermionic sources. Nor can the phase of the pulsed-laser electron-beam be readily shifted with respect to a fixed time reference. Thus, matching the electron-beam pulses to the test pattern from the circuit exerciser by controlling the electron-beam source does not appear feasible with a pulsed-laser photoemission source.

A further problem is raised by the fact that switching times of elements within the device under test (DUT) can be below 10 ps, yet conventional techniques of connecting to the device do not allow signals with transition times much below 50 ps to be effectively coupled into or out of the device. In general, a complex component is made by interconnecting thousands of active elements together on a chip. What is of interest is the actual performance of elements internal to the device. The non-contact, high-bandwidth measurement technique of electron-beam probing allows detailed observation of the timing relationships of signals internal to the device.

In order to make the most accurate, low-jitter measurements, the bandwidth of the connection between the test pattern generator and the device must be as high as possible to minimize degradation of switching edge speeds. Even then, each device connection (e.g., bond wire, probe pin and even bond pad) represents an unknown, complex impedance between the stimulus source and the on-chip element. Exact knowledge of the waveforms at the output of the test pattern generator does not therefore guarantee knowledge of the waveforms inside the device at the element of interest. By way of illustration, FIG. 2 shows schematically a portion of a VLSI circuit device 30 mounted on a carrier 32. Active elements forming part of device 30 include flip-flops 34 and 36 and inverters 38 and 40. Each of flip-flops 34 and 36 has a data input port D and a clock input port C. Bond wire 42 electrically connects bond pad 44 of device 30 to bond pad 46 of carrier 32. Bond pad 46 is in turn electrically connected to an input pin 48. Circuit exciser 14 causes the electron-beam probe to be pulsed in stroboscopic fashion by sending trigger pulses (as shown in line "a" of FIG. 3) to the test probe 12. Test patterns produced by circuit exerciser 14 are synchronized with these trigger pulses. While circuit exerciser 14 may be capable of generating a test pattern having a rising edge of, say, 10 ps duration as shown in line "b" of FIG. 3, the impedance encountered over the path from input pin 48 to the active element 34 to be examined acts as a low-pass filter and introduces some indeterminate delay. That is, the rise time of the pulse at input port 50 of active element 38 may have a duration of, say, 50 ps as shown in line "c" of FIG. 3. While on-chip element 38 may be able to restore the rise time of the pulse at input port 52 of element 34 to 10 ps as shown in line "d" of FIG. 3, the intended placement of the rising edge is no longer assured.

SUMMARY OF THE INVENTION

It is an object of the present invention to overcome many of the limitations of the prior art as outlined above. It is further an object of the present invention to offer a practical electron-beam probe system capable of making high-accuracy, low-jitter measurements of signals within circuit devices (such as ultra high-speed VLSI circuit devices) with the aid of a pulsed-laser photoemission electron-beam prober. These and other objects are attained with embodiments of the methods and apparatus of the present invention.

In accordance with a preferred embodiment of the invention, an electron-beam test probe system (400) is provided in which a pulsed laser-beam source (404) and a photocathode assembly (430) are used with an electron-beam column (426) to produce a pulsed electron beam at a stabilized repetition frequency. A pulse picker (414) allows the pulse repetition frequency of the pulsed electron beam to be reduced to a submultiple of the pulsed laser repetition frequency. A test pattern generator (416) is programmable to apply a desired pattern of test vector patterns to an electronic circuit to be probed, the test vector patterns being synchronized with the stabilized laser-beam pulse repetition frequency. A timebase circuit (412) allows the test vector patterns to be time-shifted relative to the pulsed electron beam. The electronic circuit under test can thus be probed at any desired point in the applied test vector pattern by control of the pulse picker and by time-shifting the test vector pattern.

These and other features of the invention will become apparent to those of skill in the art from the following description of preferred embodiments of the invention and the accompanying drawing figures.

DESCRIPTION OF THE PREFERRED EMBODIMENTS

In accordance with the present invention, an electron beam is used not only as a high-bandwidth, guided probe for interactive waveform measurement but also as a tester (circuit exerciser) calibration probe. The test pattern applied to the external pins of the DUT can be adjusted (e.g., time-shifted) while the actual signal at a port of an element of interest (e.g., an active element such as a flip-flop on the DUT) is observed. In this way, test pattern edges may be placed with precision of a few picoseconds (ps) at each port of an element of interest, before further measurements are made within the DUT.

For this to be effective, it is necessary to achieve an exceptionally high measurement bandwidth. This may be done by adapting the technique described by IBM (mode-locked, laser-based photoemission for fast sampling pulse generation). The present invention is directed to implementation of a practical electron beam probing system with a time resolution on the order of 10 ps, together with a low-jitter, high-accuracy test pattern source with multiple output pins and flexible formatting capability.

In accordance with preferred embodiments of the present invention, the basic architecture of the Schlumberger IDS 5000 electron beam diagnostic system is retained to provide a convenient user interface and convenient access to the electronic circuit under test. Significant modifications made, however, are described below.

Figure 1:
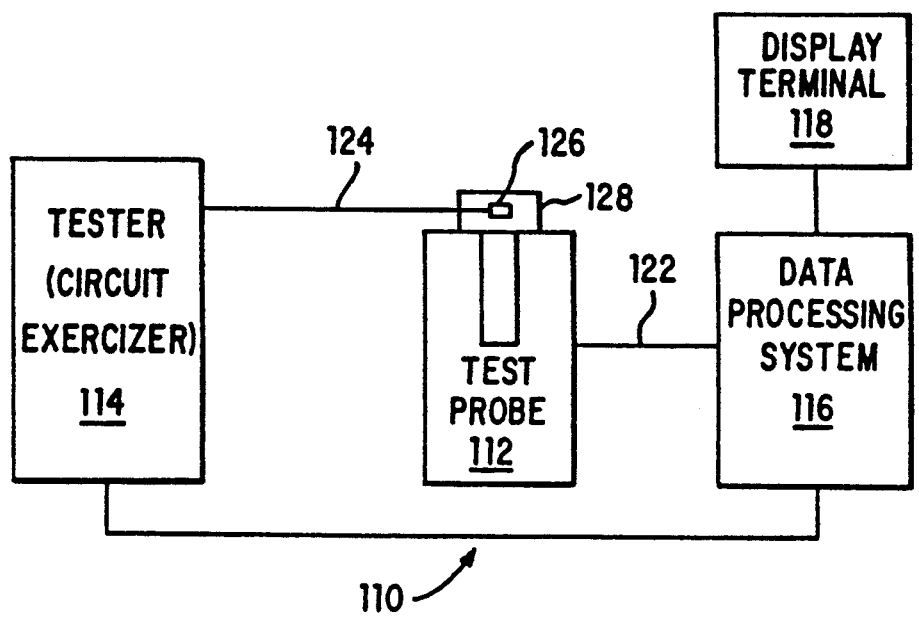
FIG. 1 is a block diagram of a prior art electron-beam test probe system.
Figure 2:
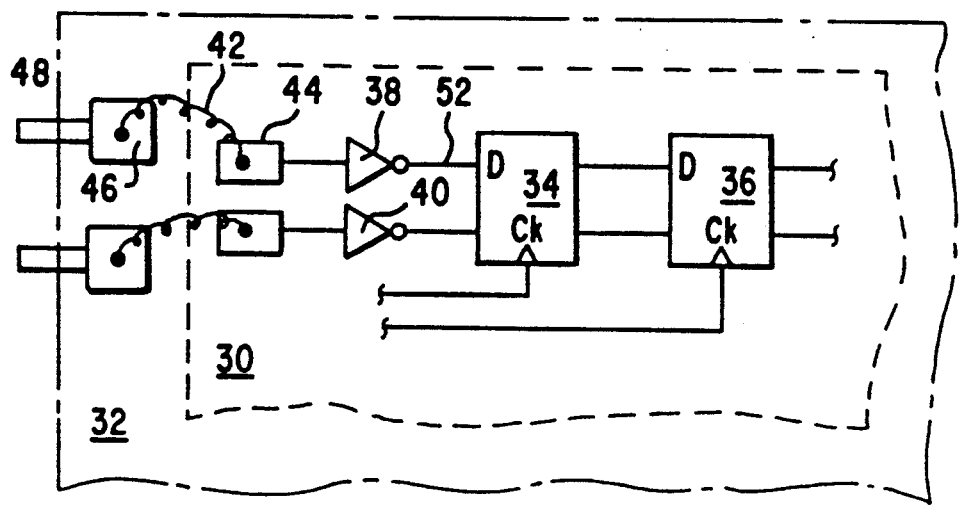
FIG. 2 is a schematic diagram of a portion of a VLSI circuit device mounted on a carrier, as known in the prior art.
Figure 3:
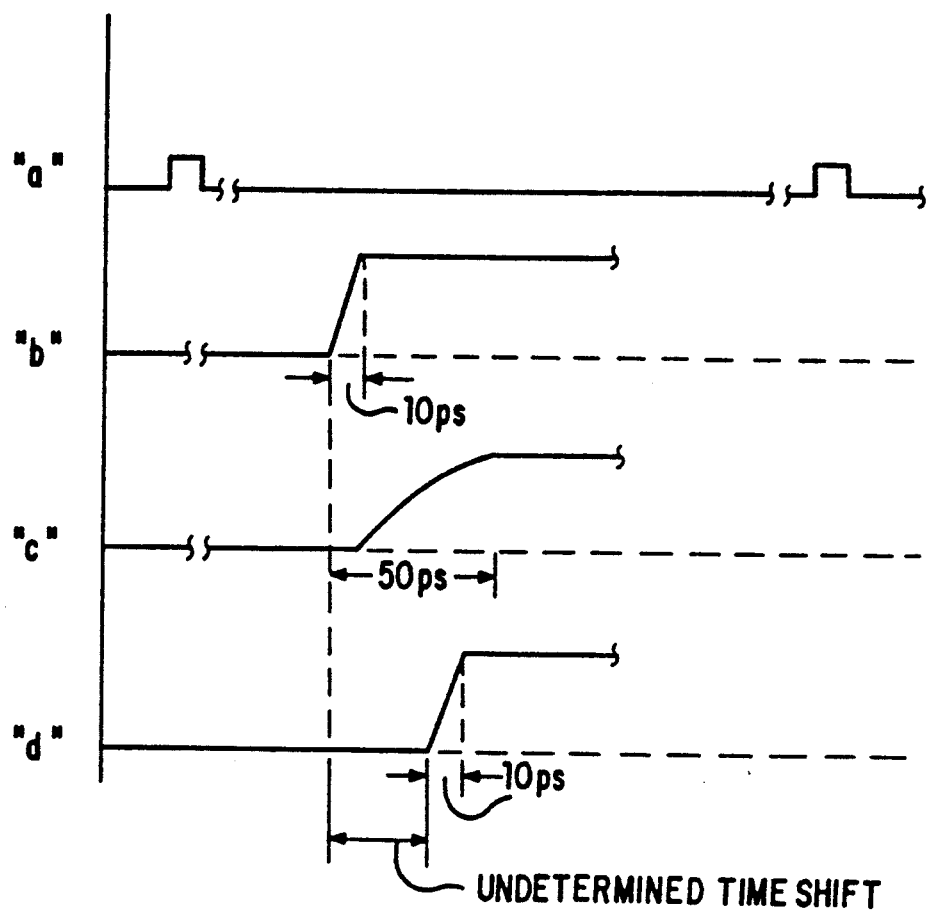
FIG. 3 is a timing diagram illustrating a shortcoming of prior art methods of electron-beam probing of a VLSI circuit device of the type shown in FIG. 2.
Figure 4:
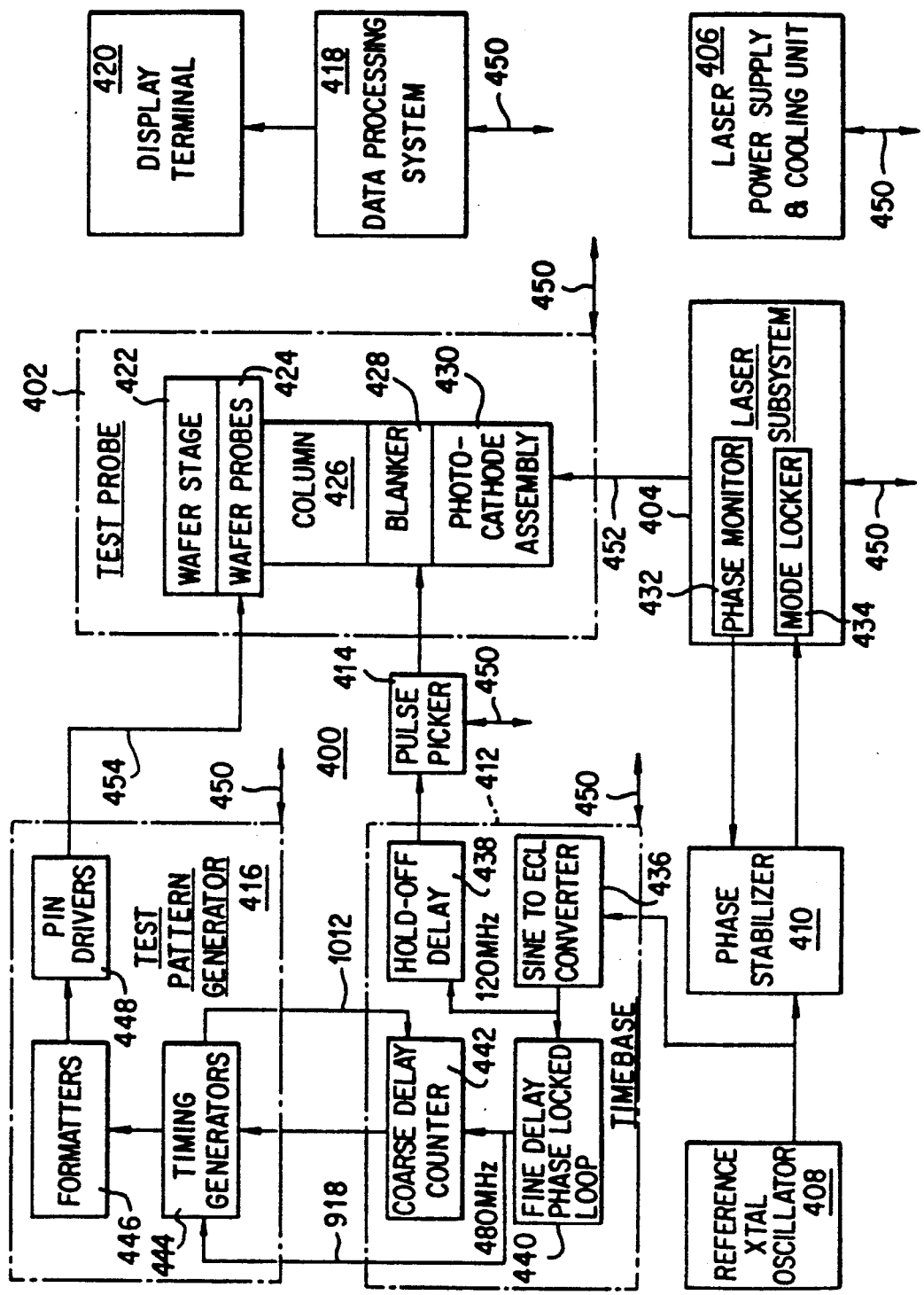
FIG. 4 is a simplified schematic view of a system in accordance with the present invention.

FIG. 4 is a schematic block diagram of a preferred embodiment of an electron-beam system 400 in accordance with the present invention. System 400 comprises a test probe 402, a laser subsystem 404 with associated power supply and cooling unit 406, an optical coupler 452 (such as a light pipe or optical fiber), a reference oscillator 408, a phase stabilizer 410, a timebase circuit 412, a pulse-picker circuit 414, a test pattern generator 416, a set of controlled-impedance transmission lines 454, a data-processing system 418, and a display terminal 420.

Test probe 402 comprises a wafer stage 422 for holding and positioning a wafer bearing one or more IC devices to be probed, wafer probes 424, an electron-beam column 426, an electron-beam blanker 428 (e.g., of the type described in U.S. Pat. No. 4,721,909), and a photocathode assembly 430. Laser subsystem 404 includes a mode locker 432 and a phase monitor 434, among other elements which will be described below. Timebase circuit 412 comprises a sine-to-ECL converter 436, a hold-off delay 438, a fine-delay phase-locked loop 440, and a coarse delay counter 442. Test pattern generator circuit 416 comprises a set of timing generators 444, a set of formatters 446, and a set of pin drivers 448. Data processing system 418 communicates with each of the system elements via control and data lines 450 which may, for example, be in the form of one or more serial and/or parallel data buses.

In operation, reference oscillator 408 produces a 120 MHz sine wave reference signal which is supplied to phase stabilizer 410 and to timebase circuit 412. The use of a phase stabilizer is optional, and serves to reduce low-frequency phase noise in the output pulse stream (jitter). Phase stabilizer 410 in turn supplies a 120 MHz sine wave drive signal to mode locker 434 of laser subsystem 404. Phase monitor 432 provides a feedback signal to phase stabilizer 410 to assure stabilization of the output pulse train of laser subsystem 404. Laser subsystem 404 generates a train of ultraviolet (UV) wavelength laser pulses at a repetition frequency of 240 MHz, the laser pulses being conveyed via an optical coupler (light pipe or optical fiber) 452 to photocathode assembly 430 of test probe 402. Photocathode assembly 402 produces an electron-beam pulse in response to each laser pulse arriving through light pipe or optical fiber 452. The electron-beam pulses may be directed to "probe" the DUT and supply signals to data processing system 418 which may be used to display measured parameters of the DUT on display terminal 420.

Timebase circuit 412 serves to synchronize the test pattern applied to a DUT (mounted in test probe 402) with electron-beam pulses applied to the DUT. Electron-beam pulses to be applied to the DUT are selected by unblanking of the electron-beam pulse train under control of pulse picker 414 and hold-off delay 438, hold-off delay 438 being supplied with the 120 MHz reference signal via sine-to-ECL converter 436. A test pattern to be applied to the DUT may be controllably time-shifted relative to the electron-beam pulse train by means of the fine-delay phase-locked loop 440 and coarse-delay counter 442. A desired pattern of test vectors to be applied to the DUT is generated by means of timing generators 444 and formatters 446, and supplied to the DUT via pin drivers 448, controlled-impedance transmission lines 454, and wafer probes 424. As the DUT is exercised by the applied test vector pattern, the test-vector pattern may be time-shifted relative to the laser/e-beam pulses by control of timebase circuit 412. The time shift imposed by timebase circuit 412 is controlled by data processing system 418 via control and data lines 450. Test pattern edges at conductors of interest within the DUT may thus be controllably time-positioned relative to the electron-beam probe pulses applied to those conductors.

ELECTRON BEAM PROBE 402

Figure 5:
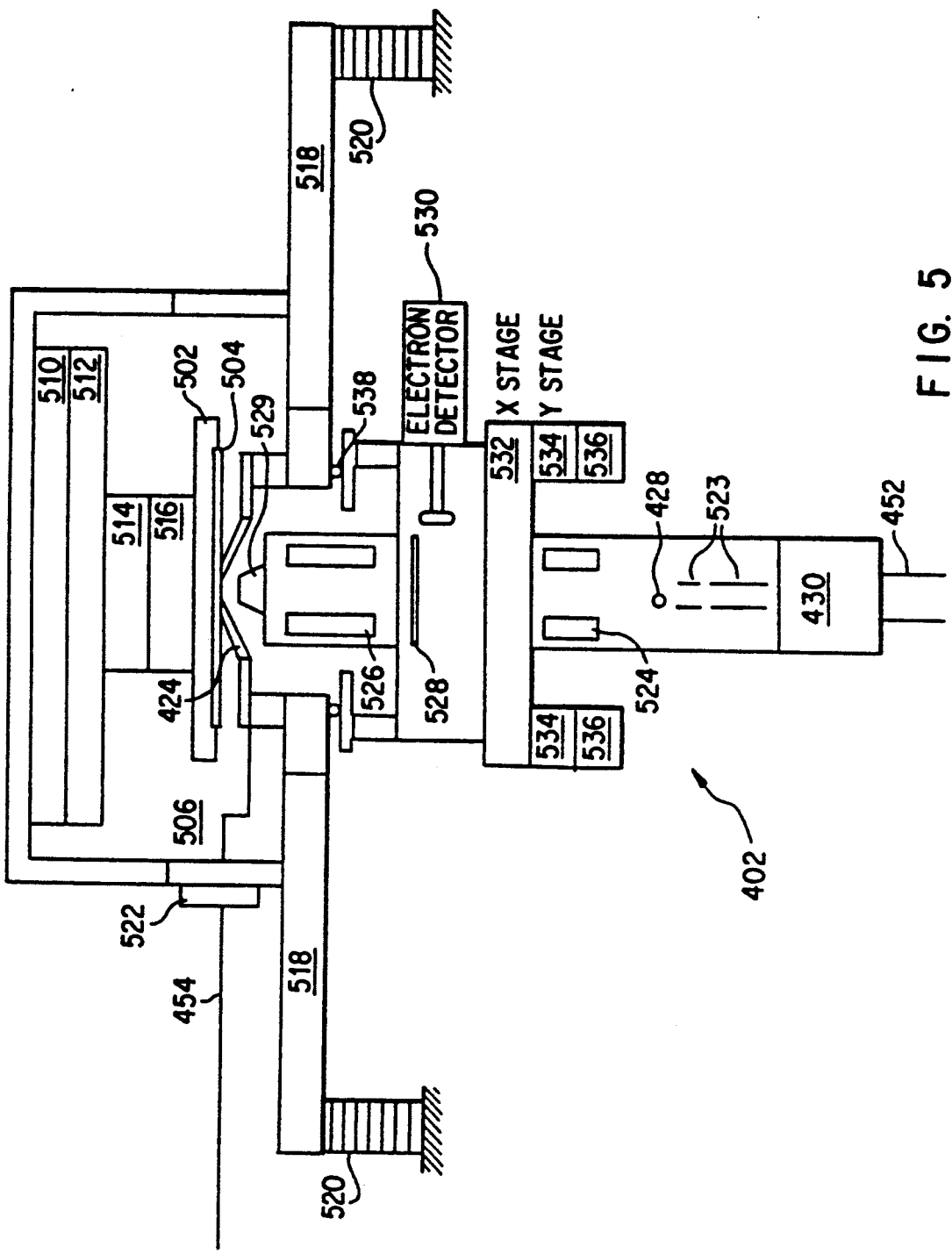
FIG. 5 is a schematic, sectional view of the test probe of FIG. 4.

FIG. 5 is a schematic, sectional view of the test probe of FIG. 4. Wafer stage 422 comprises a chuck 502 for holding a wafer 504 within a vacuum chamber 506, and an X stage 510, a Y stage 512, a Z stage 514 and a Theta stage 516 for positioning chuck 502 and wafer 504 relative to wafer probes 424. Such a positioning stage is described in U.S. Pat. No. 4,706,019 and provided, for example, in the commercially-available Schlumberger IDS 5000 system. Wafer stage 422 is mounted on a base plate 518 which is supported on vibration isolators 520. A hermetic feedthrough 522 is provided for passing signals via transmission lines 454 to wafer 504 via wafer probes 424. Electron-beam column 426 comprises an electrostatic lens assembly 523, a condenser lens 524, an objective lens 526, an energy analyzer electrode 528, an extractor electrode 529, an electron detector 530, an X stage 532 and a Y stage 534 mounted on supports 536. A sliding vacuum seal 538 allows electron-beam column 426 to be moved relative to wafer 504 by means of X,Y stages 532 and 534 without loss of vacuum in chamber 506. For simplicity, well-known elements of the test probe are not illustrated in FIG. 5, such as control and signal and power lines to and from the stages, lenses and electron detector.

In operation, the circuit device under test (e.g., on wafer 504) is placed in vacuum chamber 506, which is evacuated by means of a pump (not illustrated). If the circuit device is packaged, an adapter comprising a printed circuit board and device socket are used to connect the pins of the DUT to incoming test patterns from the circuit exerciser, in conventional fashion. In the case where the DUT is on a wafer 504 as shown in FIG. 5, high-bandwidth co-planar waveguide wafer probe pins may be used to deliver the incoming test patterns (e.g., WPH 700 series, available from Cascade Microtech, of Beaverton, Oregon). The standard Cascade Microtech probe has mode suppressing material extending over the ceramic blade of the probe which may interfere with the support of energy analyzer extraction electrode 528 of electron-beam column 426. Cascade Microtech confirms that this piece of the mode suppressor can be removed if necessary (for example, by machining). Transmission lines 454 may be individual coaxial cables or may be microstrip fabricated by depositing copper traces on a flexible substrate such as polyimide. Microstrip transmission lines are also available from Cascade Microtech.

Figure 6:
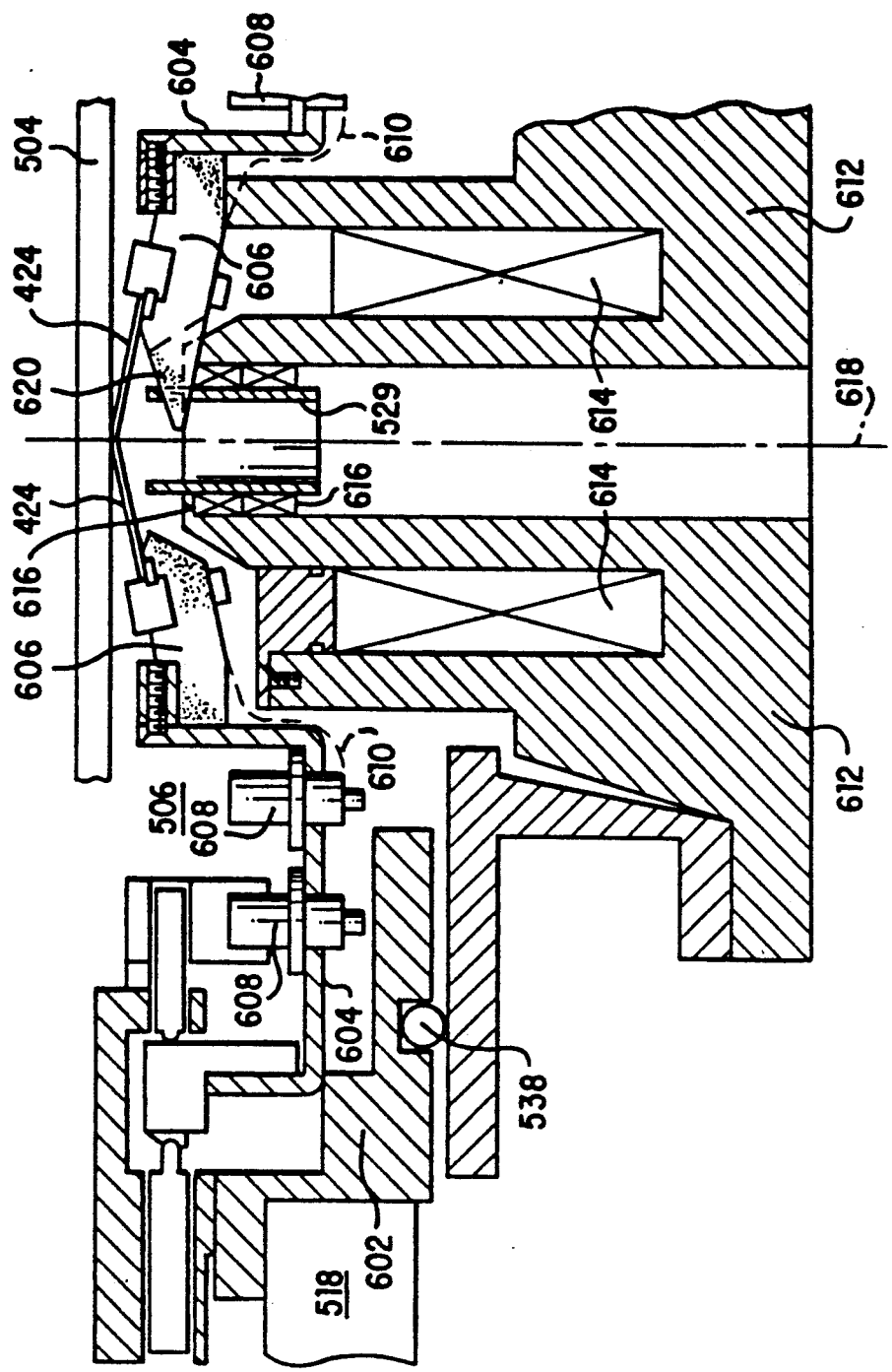
FIG. 6 is a partial sectional view of the wafer probes and portions of the electron-beam column of FIG. 4.

FIG. 6 is a partial, sectional, schematic view showing in greater detail the wafer probes and portions of the electron-beam column of FIG. 4. Mounted on base plate 518 is a support member 602, into which is fitted a probe carrier 604. Wafer probes 424 are mounted on mode suppressors 606 (of a lossy, ferrite material), which are in turn mounted on probe carrier 604. Adjusting screws (not shown) facilitate alignment of the wafer probe tips in the plane of a wafer 504 to be probed. Signals from pin drivers 448 are conveyed to wafer probes 424 by coaxial cables (not shown) via SMA-type connectors 608 and flexible microstrip transmission lines 610 (shown as dashed lines). The upper end of column 426 includes an objective lens body 612, an objective lens coil 614, extractor electrode 529 (which may include a mesh, not shown), and deflection coils 616 (for scanning and/vectoring the electron beam). The electron-optical axis of the body 612 and/or vectoring the electron beam). The electron-optical axis of the body 612 indicated by dashed line 618.

Body 612 is laterally movable relative to base plate 518 and support member 602 by means of stages 532 and 534, for aiming the electron-beam probe at a desired location on wafer 504. Seal 538 allows such movement without loss of vacuum in chamber 506. Shown at the left side of axis 612 is a mode suppressor 606 which has been modified to allow room for the upper end of body 612 and electrode 529. Shown at the right side of axis 612 is a mode suppressor 606 which has not been so modified; phantom lines indicate the region of where mode suppressor end portion 620 may interfere with body 612 and electrode 529. It is the end portion 620 which is preferably removed (as mentioned above) to avoid such interference.

LASER SUB-SYSTEM 404

Figure 7:
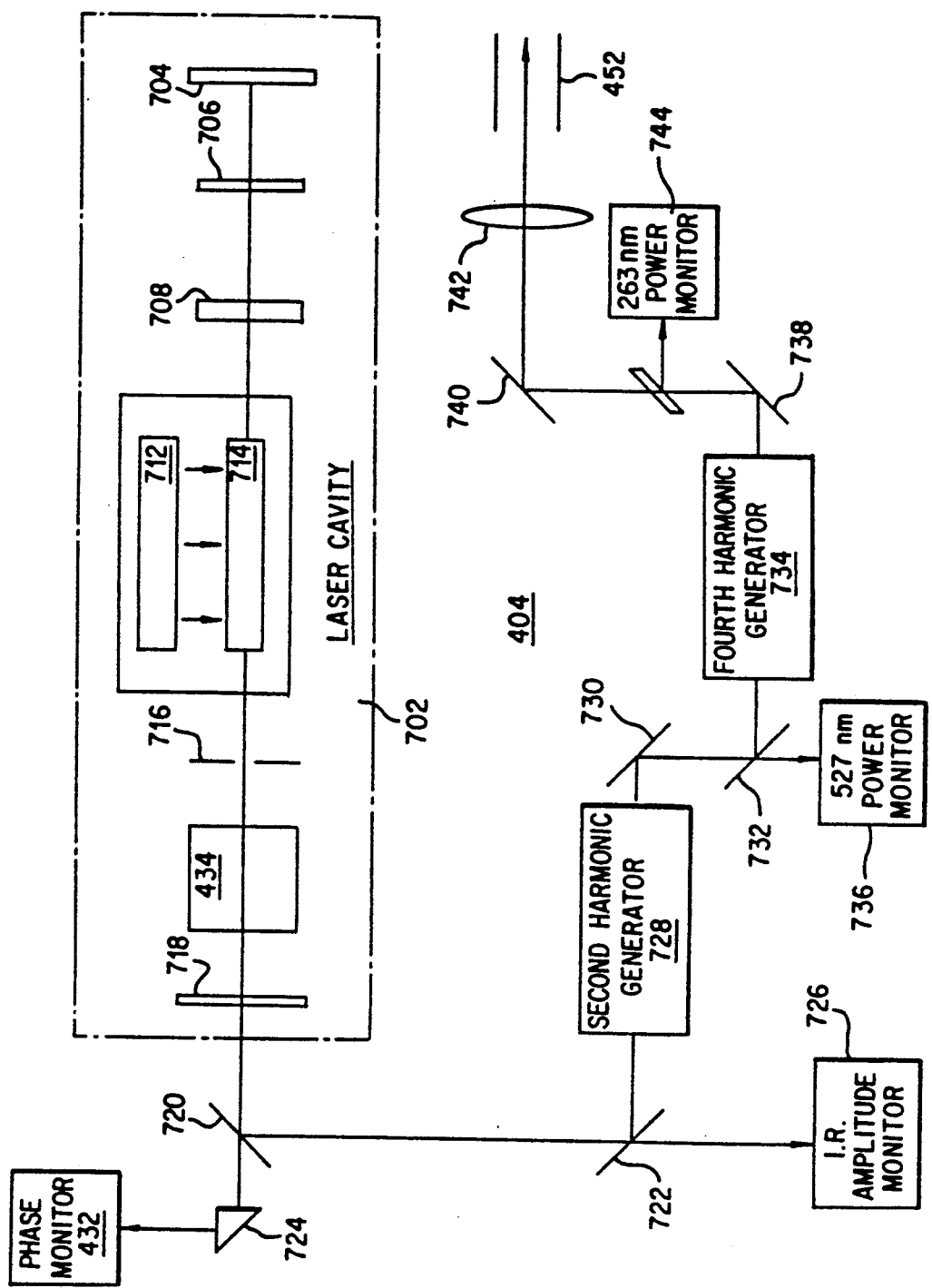
FIG. 7 is a schematic plan view of the pulsed-laser subsystem of FIG. 4.

The layout of pulsed-laser sub-system 404 of FIG. 4 is shown in schematic plan view in FIG. 7. In a first (laser cavity) stage 702, a flash-lamp-pumped, short-cavity, mode-locked, Neodymium-YLF (Yttrium-Lithium-Fluoride) laser produces pulses of 25 ps duration, about 4 W average power, at 1053 nm in the infra-red (IR) frequency range. The first stage comprises a high-resolution mirror assembly 704, a cavity length adjuster 706, an intra-cavity shutter 708, a laser head 710 having a pump lamp 712 and a laser medium 714, an aperture 716, mode locker 434, and an output mirror 718.

Beam turning mirrors 720 and 722 pass the pulsed IR laser beam to the second stage, and allow the beam to be sampled by phase monitor 432 via a right-angle prism 724 and by an IR amplitude monitor 726. A feedback signal output from phase monitor 432 is supplied to phase stabilizer 410 as shown in FIG. 4.

The second stage of laser subsystem 404 comprises a second-harmonic generator 728 which preferably includes a KTP (potassium titanyl phosphate) frequency-doubler crystal which converts the incoming IR pulses to shorter duration pulses (e.g., pulses of $25/\sqrt{2}$ ps duration) in the green part of the spectrum (e.g., at 527 nm wavelength) at much lower power (e.g., a few hundred milliwatts). The second stage further comprises beam-turning mirrors 730 and 732, the latter permitting sampling of the green laser pulses by a 527 nm power monitor 836.

The green output beam from the second stage is fed to a fourth-harmonic generator 734 of the third stage.

Fourth-harmonic generator 734 includes a final doubler crystal (for example, of beta barium borate (BBO) or KDP crystals) which converts the green pulses from the second stage into pulses of about 12 ps duration at 263 nm in the ultra-violet (UV) range at still lower power (e.g., a few milliwatts). The third stage further comprises beam-turning mirrors 738 and 740, and a 263 nm power monitor 744.

The final stage of the laser sub-system includes beam focusing optics 742 which pass the UV laser pulses to optical coupler 452. Optical coupler 452 is preferably a light pipe (e.g., produced by Laser Mechanisms of Southfield, Mich., and available through Quantronix Corporation of Smithtown, N.Y. comprising a flexible or articulated tube having knuckle joints fitted with mirrors to convey the pulsed UV beam to photocathode 430, though other suitable means such as a single-mode UV fiber or the like may be used.

The output of IR amplitude monitor 726 is used for internal regulation of laser subsystem 404, as are the outputs of power monitors 736 and 744. As is known in the art, the frequency doubler crystals of generators 728 and 734 must be temperature-controlled. The internal regulation means of laser subsystem 404 is not illustrated, for simplicity of description.

A flash-lamp-pumped, short-cavity, mode-locked, Neodymium-YLF laser of the type described is commercially available from Quantronix Corporation of Smithtown, N.Y., Model 498MLSHFH-240.

Those of skill in the art will recognize that the described laser subsystem provides a highly-stable source of narrow UV pulses (e.g., having a pulse width on the order of 12 ps) at a repetition frequency of, for example, 240 MHz. Other suitable laser sources may be used, if desired. In the work done at IBM (referenced above), a long-cavity YAG laser was used, which gives fairly broad pulses on the order of 70 ps, and employs a fiber grating compressor. It requires that the beam be launched into a fiber, and tends to be difficult to handle. The flash-lamp-pumped, short-cavity, mode-locked, Neodymium-YLF laser described above with reference to FIG. 7 is expected to be somewhat less performant (e.g., 12 ps pulse width vs. 2 ps pulse width), but is preferred as it currently appears to offer the greater durability and stability desired for a commercial system.

Numerous other modifications to the laser subsystem are also possible. For example, it may be possible to mount harmonic generator 734 onto photocathode assembly 430, and to employ a flexible optical coupler to convey green laser light from generator 728 to generator 734. Similarly, it may be possible to mount harmonic generators 728 and 724 onto photocathode assembly 430, and to employ a flexible optical coupler to convey infrared laser light from first stage 702 to harmonic generator 728. Also, it is envisioned that pump flash-lamp 712 may be replaced with solid-state, infrared diodes. In this case, it may be possible to mount substantially all of the laser subsystem onto photocathode assembly 430, which is affixed to and moves with column 426.

PHOTOCATHODE ASSEMBLY 430

Figures 8A, 8B:
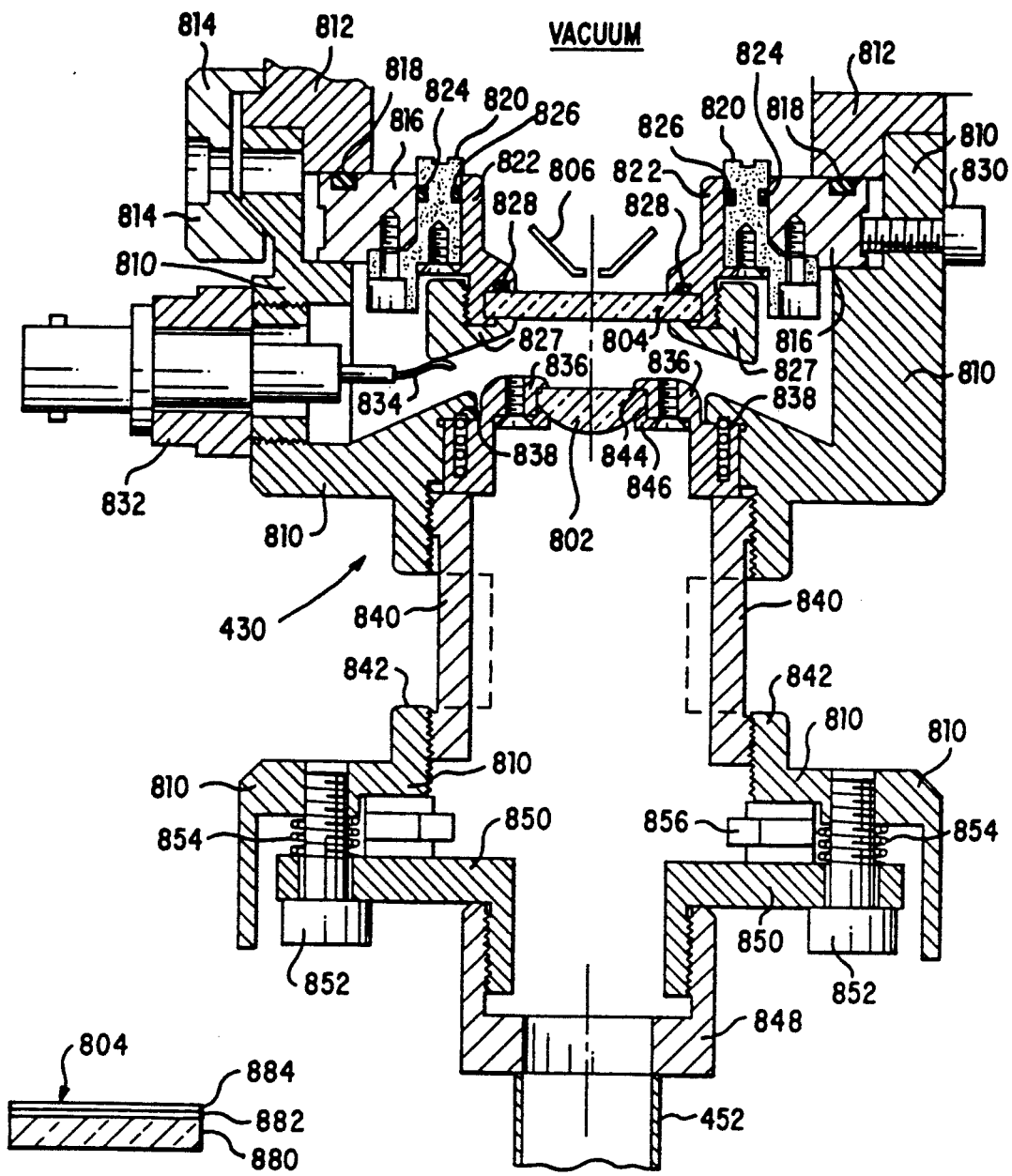
FIG. 8A is a cross-sectional view of a portion of the test probe of FIG. 4.
FIG. 8B is a sectional view of photocathode 804.

FIG. 8A is a cross-sectional view of a portion of test probe 402 showing principal elements of photocathode assembly 430 and certain surrounding components. Ultraviolet laser pulses arriving via optical coupler 452 pass through a focusing lens 802 to a photocathode element 804 which produces an electron-beam pulse in response to each laser pulse. The electron-beam pulses pass through an aperture in an extractor anode 806 of electron-beam column 426. Anode 806 is preferably maintained at a relatively high positive voltage (e.g., 3 kV–4 kV) so as to accelerate the electrons sufficiently to avoid space-charge spreading of the electron-beam pulses. As shown in FIG. 8B, photocathode element 804 preferably comprises a transparent, quartz disk 880 of 3 mm thickness, optically polished on both faces to transmit UV laser light with minimum distortion, with a layer of calcium fluoride 882 deposited on its upper surface and with a layer of gold 884 deposited over the calcium fluoride layer.

Photocathode assembly 430 is preferably designed to replace the thermionic electron-beam gun of a conventional IDS 5000 TM test probe system. As shown in FIG. 8, a generally-cylindrical main body 810 mounts on the lower end 812 of electron-beam column 426, and is held in place by a clamp 814. Held between column lower end 812 and a shoulder of main body 810 is a conductive, photocathode carrier ring 816. O-ring 818 hermetically seals the junction between column lower end 812 and carrier ring 816. An insulator ring 820 mounts within carrier ring 816, and a conductive photocathode support ring 822 mounts within insulator ring 820. The junctions between carrier ring 816 and insulator ring 820, and between insulator ring 820 and support ring 822, are hermetically sealed by O-rings 824 and 826, respectively. Photocathode 804, which fits into support ring 822, is held in place by a conductive closure ring 827 which threads onto the lower end of support ring 822. An O-ring 828 hermetically seals the junction between photocathode 804 and support ring 822.

It can be seen that, due to the hermetically-sealed junctions, photocathode 804 serves as a lower vacuum boundary of electron-beam column 426. That is, the region above photocathode 804 is contiguous with the evacuated column 426 and chamber 506, and the region below photocathode 804 contains air at atmospheric pressure. One or more screws 830 threaded into main body 810 serve to laterally position carrier ring 816. The photocathode may be refreshed from time to time by turning screws 830 to laterally displace carrier ring 816. O-ring 818 slides relative to the lower surface of column lower end 812 without breaking the hermetic seal.

A connector 832 provides a cathode-voltage connection to closure ring 826 via a spring contact 834. The cathode voltage is applied to the gold surface of photocathode 804 via closure ring 826 and support ring 822. Main body 810 is maintained at a voltage of, for example, minus 1000 volts relative to ground.

A lens support ring 836 slidably disposed in a bore of main body 810 is resiliently biased downwardly by a spring 838 and retained by a focusing barrel 840. Focusing barrel 840 is threaded into the interior bore of main body 810, and may be manually rotated to adjust the vertical position of lens support ring 836 relative to main body 810. Cut out regions 842 of main body 810 allow access to barrel 840 for this purpose. Lens 802 is held against a shoulder 844 of lens support ring 836 by a retainer ring 846. Rotation of focusing barrel 840 allows the parallel laser beam arriving at lens 802 to be focused to a spot at photocathode 804 by axial adjustment of the position of lens 802.

Optical coupler 452 (e.g., a light pipe) attaches by means of a screw coupler ring 848 to a flanged ring 850 which is in turn mounted within the lower bore of main body 810 by shoulder bolts 852. Compression springs 854 resiliently bias flange 850 away from main body 810 in the axial direction. A resilient seal 856 keeps dust and other contamination from entering the bore of main body 810. The laser beam entering via optical coupler 452 may be aligned with the central optical axis of main body 810 by tilting flange 850 through suitable adjustment of shoulder bolts 852.

SYSTEM TIMEBASE CIRCUIT 412

Figure 9:
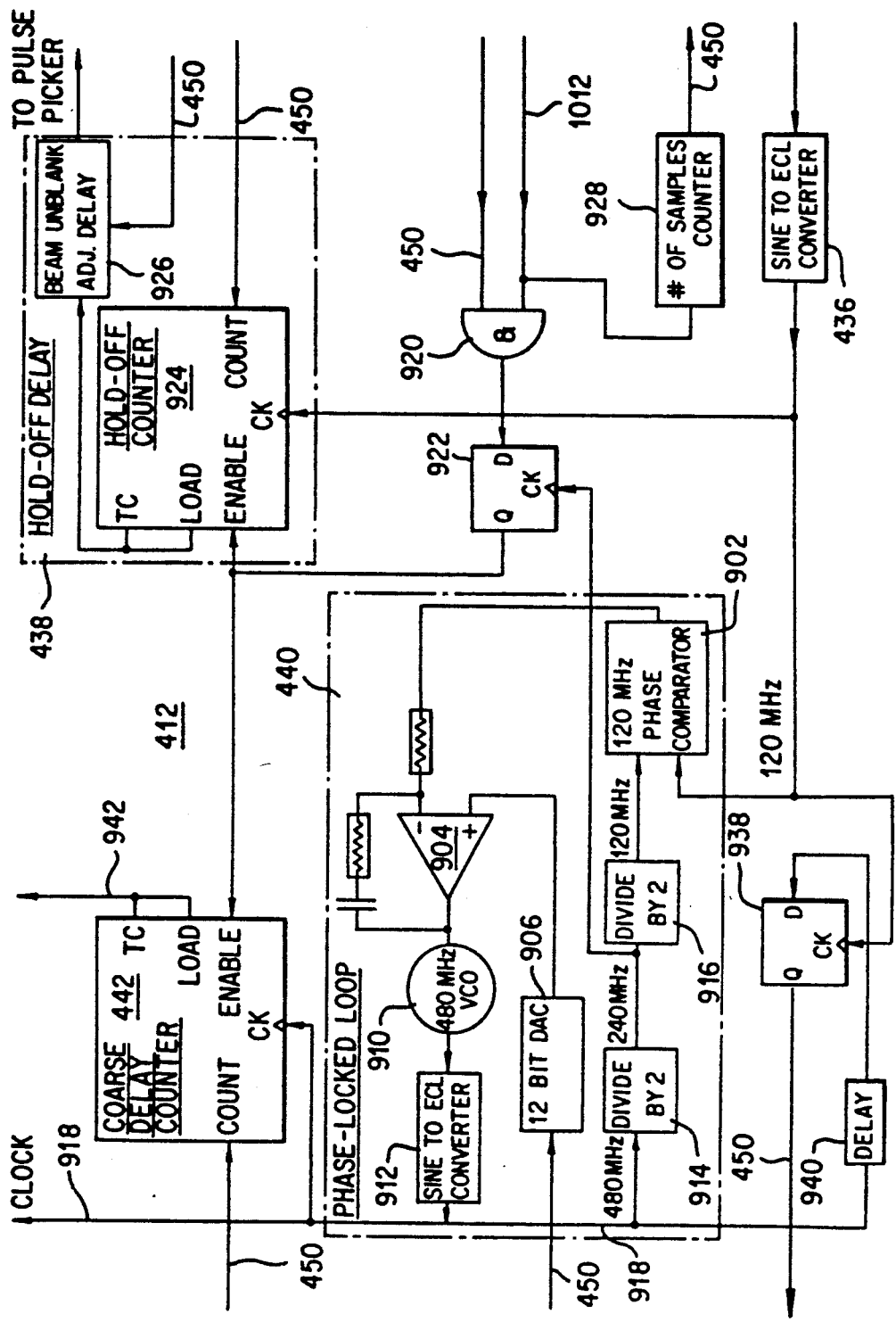
FIG. 9 is a schematic block diagram of the timebase circuit portion of FIG. 4.

FIG. 9 is a schematic block diagram of the timebase circuit portion of FIG. 4, showing the four basic elements of timebase circuit 412 (sine-to-ECL converter 436, hold-off counter 438, fine-delay phase-locked loop 440, and coarse delay counter 442) as well as minor additional logic not shown in FIG. 4.

Phase-locked loop 440 comprises a 120 MHz phase comparator 902, which receives a 120 MHz reference signal from oscillator 408 via sine-to-ECL converter 436. The output of comparator 902 is supplied to an integrator 904 whose threshold is set by time-base vernier data from data processing system 418 via data lines 450 and 12-bit digital-to-analog converter 906. A control voltage output from integrator 904 is provided via line 908 to a 480 MHz voltage-controlled oscillator 910. The output of VCO 910 is supplied via a sine-to-ECL converter 912 to series-connected divide-by-two circuits 914 and 916. The output of divide-by-two circuit 916, a 120 MHz signal, is supplied to the second input of 120 MHz phase comparator 902. It will be seen that phase-locked loop 440 provides at its main output line 918 a 480 MHz clock signal which may be controllably phase-shifted in vernier fashion over a range of ±180° by supplying appropriate time-base vernier data from data processing system 418 to 12-bit DAC 906 over data lines 450.

An AND gate 920 receives an asynchronous enable ("start" sequence) signal from data processing system 418 at a first input, and a "restart" signal from timing generators 444, as will be explained below. The output of AND gate 920 is synchronized with the 240 MHz output of divide-by-two circuit 914 in a flip-flop 922 to provide a "sync enable" signal to the enable input of coarse delay counter 442. The 480 MHz clock signal at output line 918 of phase-locked loop 440 is supplied to the clock input of coarse delay counter 442. The terminal count value of coarse delay counter 442 is set by timebase counter data from data processing system 418 via data lines 450. A number-of-samples counter 928 counts the restart pulses on line 1012 (from a counter 1010 shown in FIG. 10), and the stored count value is monitored by data processing system 418.

When the async enable and restart signals supplied to AND gate 920 assume a logic high level, coarse delay counter 442 will being counting in sync with the 480 MHz clock signal from phase-locked loop 480. When coarse delay counter 442 reaches its terminal count value, it provides a "sync enable delayed" output signal to timing generators 444 and to its own load input to reset itself for the next count cycle.

The sync enable signal from flip-flop 922 is also supplied to the enable input of a hold-off counter 924 of hold-off delay circuit 438. The 120 MHz reference signal from sine-to-ECL converter 436 is supplied to the clock input of hold-off counter 924. Hold-off counter 924 provides an output signal, at a predetermined number of 120 MHz clock cycles following receipt of the sync enable signal, to a beam unblank adjustable delay circuit 926. Beam unblank adjustable delay circuit is a vernier delay which allows the output from hold-off counter to be controllably adjusted over a range of ±½ of one 120 MHz reference cycle. The output of beam unblank adjustably delay circuit 926 is supplied to pulse-picker circuit 414 (e.g. a monostable flip-flop) which briefly unblanks beam blanker 428. The collective delay period of hold-off counter 924 and beam unblank adjustable delay are controlled by data processing system 418.

A D-type flip-flop may be supplied at its D input with the 120 MHz reference signal from sine-to-ECL converter 436, and at its clock input with the 480 MHz signal from sine-to-ECL converter 912 (via a delay element 940), to provide a calibration output signal. The calibration output signal from flip-flop 938 is a status bit monitored by data processing system 418 on the system bus to indicate coincidence of a vernier-delayed edge of the 480 MHz clock signal on line 918 with an edge of the 120 MHz clock signal from sine-to-ECL converter 436. Vernier-shifting the 480 MHz clock signal through a full cycle of phase shift by modification of the fine-delay data to DAC 906 allows data processing system 418 to determine a vernier scaling factor of the 480 MHz clock signal relative to the 120 MHz clock signal.

TEST PATTERN GENERATOR 416

Figure 10:
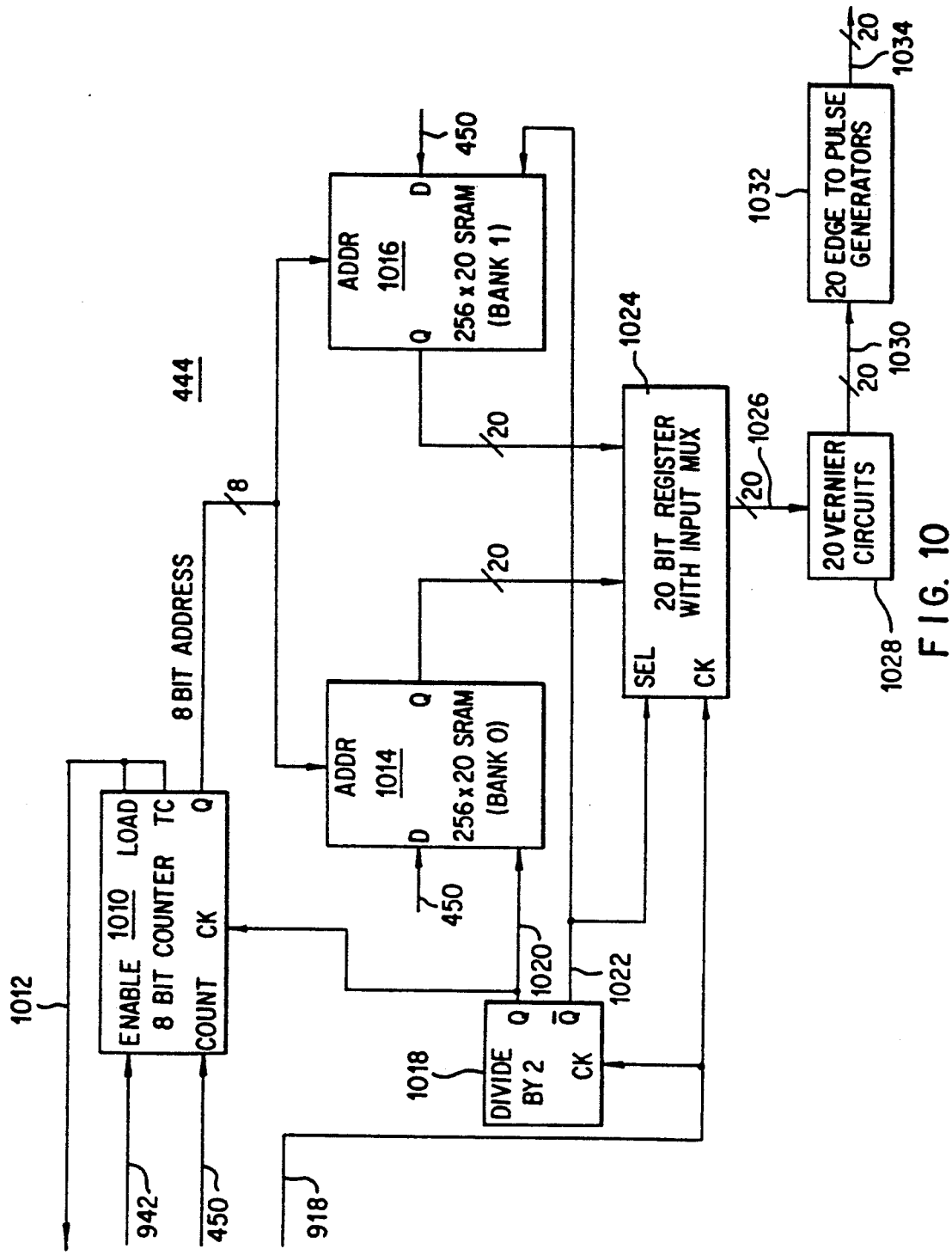
FIG. 10 is a schematic block diagram of the timing generators circuit portion of the test pattern generator of FIG. 4.

FIG. 10 is a schematic block diagram of the timing generators circuit portion of the test pattern generator of FIG. 4. An 8-bit self-resetting terminal counter/address generator 1010 receives the sync enable delayed signal from coarse delay counter 442 via line 942 at its count-enable input, and the 480/2 MHz clock signal via line 1020 at its clock input. The number of clock pulses per count cycle is preset by data processing system 418 via data lines 450. When triggered to do so by the sync enable delayed signal, counter/generator 1010 counts 480 MHz clock cycles until it reaches the preset terminal count, then issues a "restart" signal on output line 1012. The restart signal on line 1012 is supplied to AND gate 920 of timebase circuit 412.

Counter/generator 1010 supplies 8-bit addresses to the respective address inputs of 256×20 SRAM banks 1014 and 1016. SRAM Banks 1014 and 1016 are pre-loaded by data processing system 418 via data lines 450 with data patterns from which edge patterns are generated in response to clock signals. The 480 MHz clock signal from phase-locked loop 440 is divided in a divide-by-two circuit 1018 into two 240 MHz clock signals at Q and Q-bar output lines 1020 and 1022, respectively. The 240 MHz signals on lines 1020 and 1022, which are of opposing phase, are supplied to the respective clock inputs of SRAM banks 1014 and 1016. Thus, SRAM bank 1014 provides at its Q output a 20-bit pattern of timing edges on "even" clock cycles and SRAM bank 1016 provides at its Q output a 20-bit pattern of timing edges on "odd" clock cycles. A 20-bit register with input multiplexer 1024, multiplexes the timing edge patterns from SRAM banks 1014 and 1016 in sync with the clock signals on lines 918 and 1020 to supply a pattern of output signals on a 20-bit wide bus. The pattern may have from 1 to 20 timing edges per cycle of 8-bit counter/generator 1010, with each of those edges being synchronized with an edge of a 480 MHz clock pulse (multiple edges may transition on a single 480 MHz clock pulse, if desired). An array of vernier circuits 1028, under control of data processing system 418, allows each of the timing edges to be adjusted in vernier fashion. The vernier-adjusted timing edge pattern from vernier circuits 1028 is supplied via a 20-bit wide bus 1030 to an array of edge-to-pulse generators 1032 (e.g., monostable flip-flops). A pattern of narrow output pulses is supplied by generators 1032 via a 20-bit wide bus 1034 to formatters 446, and is repeated once for each cycle of counter/generator 1010. Counter/generator is programmable to count to any desired terminal-count value, the terminal-count value determines the number of test vectors in the desired test-vector pattern.

As counter/generator 1010 counts, it addresses each location of SRAM banks 1014 and 1016 in turn. In each column of the SRAM banks (there are 20 columns in each bank) a single "one" would be written, and the rest of the entries would be "zeros." As the counter counts down, the corresponding SRAM output goes high when a location with a "one" is addressed. Thus, the SRAM banks allow the relative time within a range of 0-512 periods to be programmed.

Multiplexing the generation of edge patterns as in the circuit of FIG. 10 has the advantage that lower-speed components may be used than would otherwise be the case. For example, SRAM banks 1014 and 1016 need only have a short enough access time to deal with a 240 MHz clock signal. It will be recognized that the pulse pattern may be generated by circuits other than that shown in FIG. 10. For example, counter/generator 1010, SRAM banks 1014 and 1016 and register/mux 1024 may be replaced with an array of counters of sufficiently high speed to be driven by the 480 MHz clock, or SRAM banks 1014 and 1016 and register/mux 1024 may be replaced with a single, high-speed memory.

FORMATTERS 446 AND PIN DRIVERS 448

Figure 11:
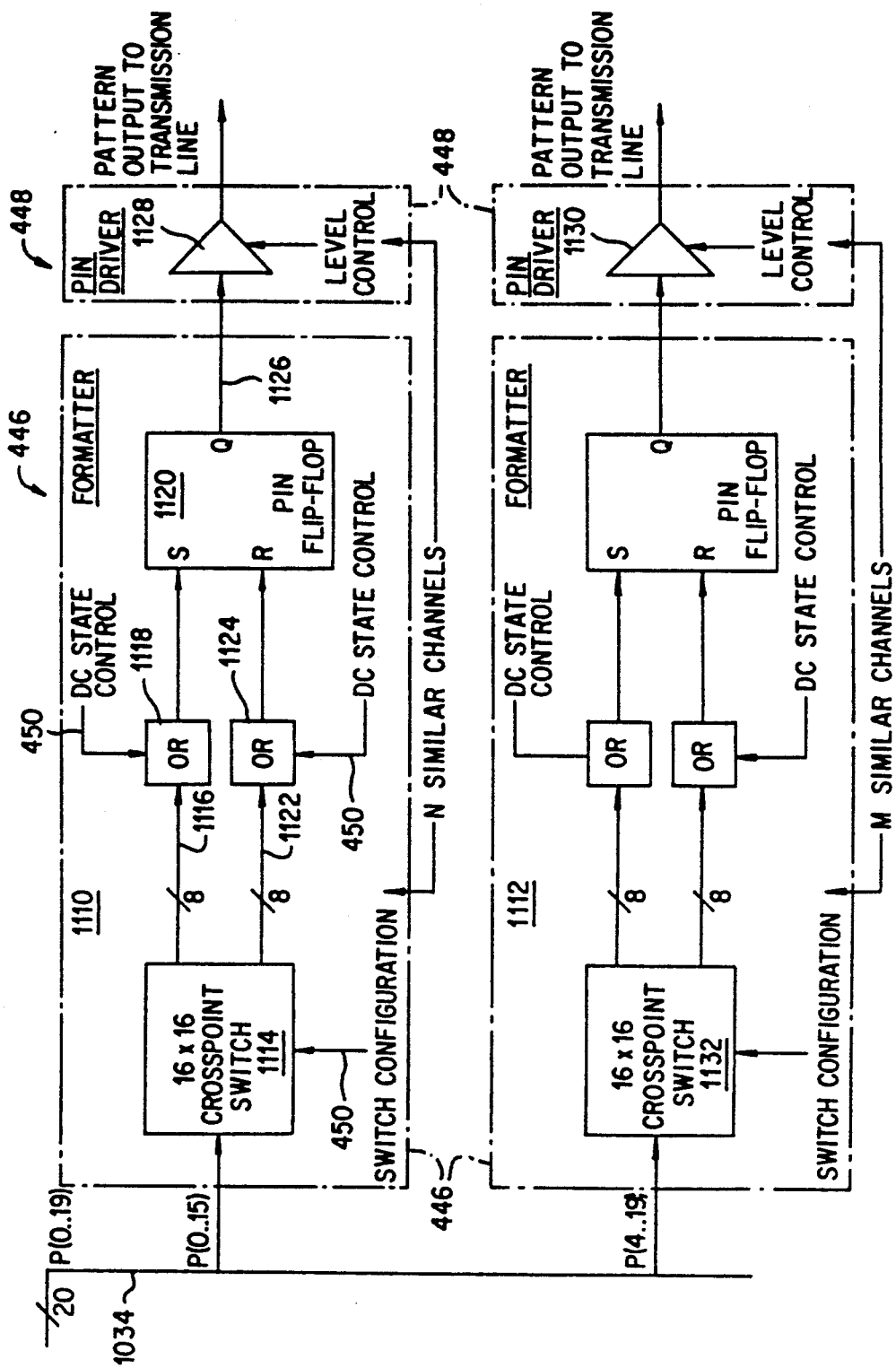
FIG. 11 is a schematic block diagram of the formatters and pin drivers circuit portions of the test pattern generator of FIG. 4.

FIG. 11 is a schematic block diagram of the formatters and pin drivers circuit portions of the test pattern generator of FIG. 4. Any number of formatters 446 may be provided, with each formatter typically driving a single pin of the DUT. A formatter 1110 comprises a 16×16 crosspoint switch 1114 (e.g., Gigabit Logic part number 10G051) which receives at its respective 16 signal inputs the pulse pattern from 16 of the 20 signal lines of bus 1034 (e.g., signal line addresses 0:15 of bus 1034, as illustrated). Crosspoint switch 1114 is a logic array which may be configured by data processing system 418 via data lines 450. Pulses appearing on a first group 1116 of 8 output lines are supplied to the inputs of an OR gate array 118 to drive the "set" input of set/reset flip-flop circuit 1120. Pulses appearing on a second group 1122 of 8 output lines are supplied to the inputs of an OR gate array 1124 to drive the "reset" input of set/reset flip-flop 1120. DC state control lines of OR gates 1118 are addressed by data processing system 418 to set the initial state of flip-flop 1120 (e.g., at the beginning of a test-vector sequence). It will be seen that the pattern of up to 8 pulses appearing at Q-output line 1126 of formatter 1110 during each clock cycle is programmable at the will of the operator under control of data processing system 418. The pulse pattern appearing at line 1126 is passed to a pin driver circuit 1128 for driving a pin of the DUT. Any number N of channels similar to that formed by formatter 1110 and pin driver 1128 may be provided.

Likewise, any number M of channels similar to that formed by formatter 1112 and pin driver 1130 may be provided. Formatter 1112 is identical to formatter 1110, except that the input lines of 16×16 crosspoint switch 1132 receive the pulse pattern from a different group of 16 of the 20 signal lines of bus 1034 (e.g., signal line addresses 4:19 of bus 1034, as illustrated). Thus, each formatter may use up to 16 to 20 pulses from the pattern on bus 1034 to form a pattern to drive a pin of the DUT, and any or all of those 16 pulses may be used in composing the pattern to drive a pin of the DUT.

SYSTEM OPERATION

Figure 12A:
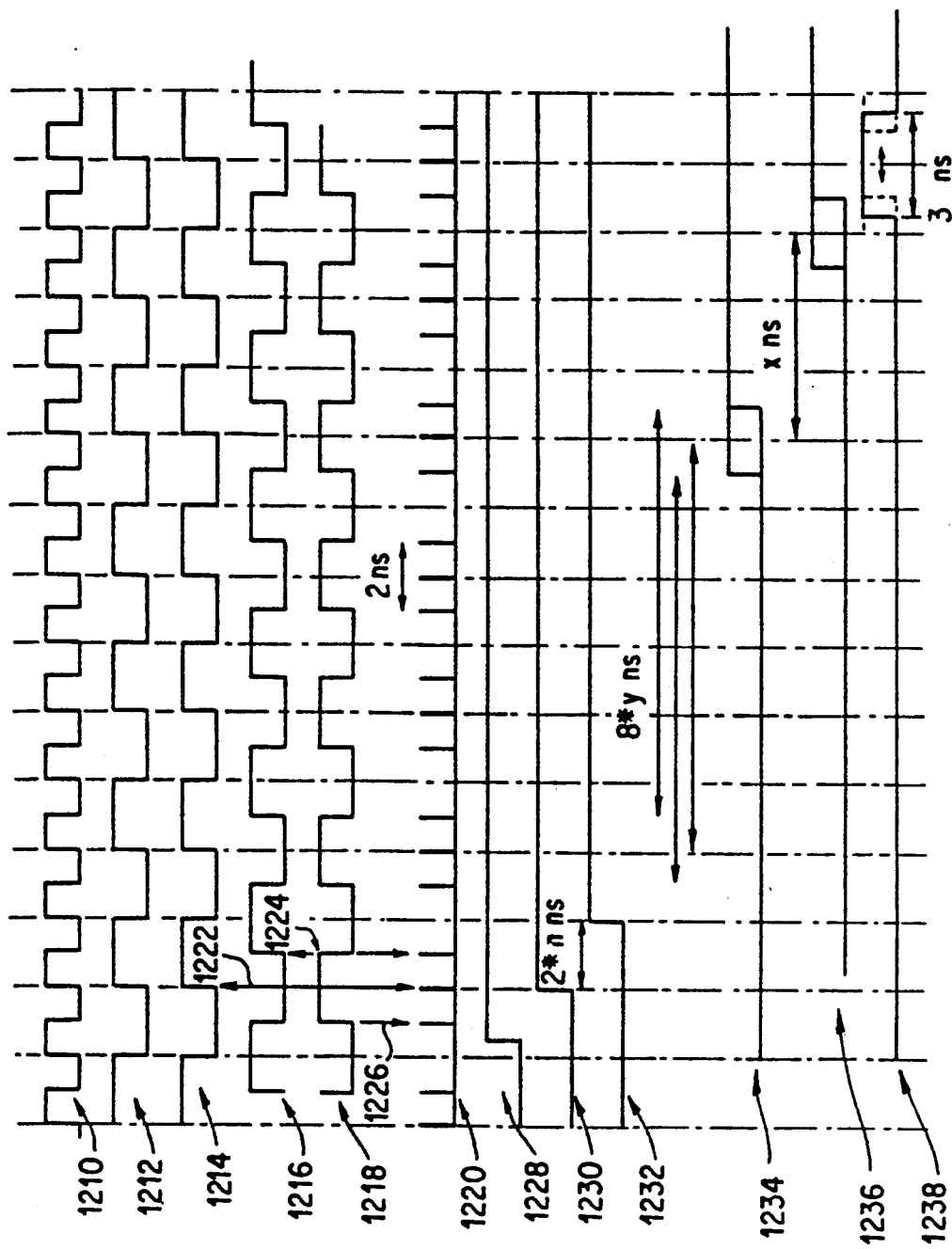
FIGS. 12A and 12B are timing diagrams showing exemplary waveforms of the system in accordance with the invention.
Figure 12B:
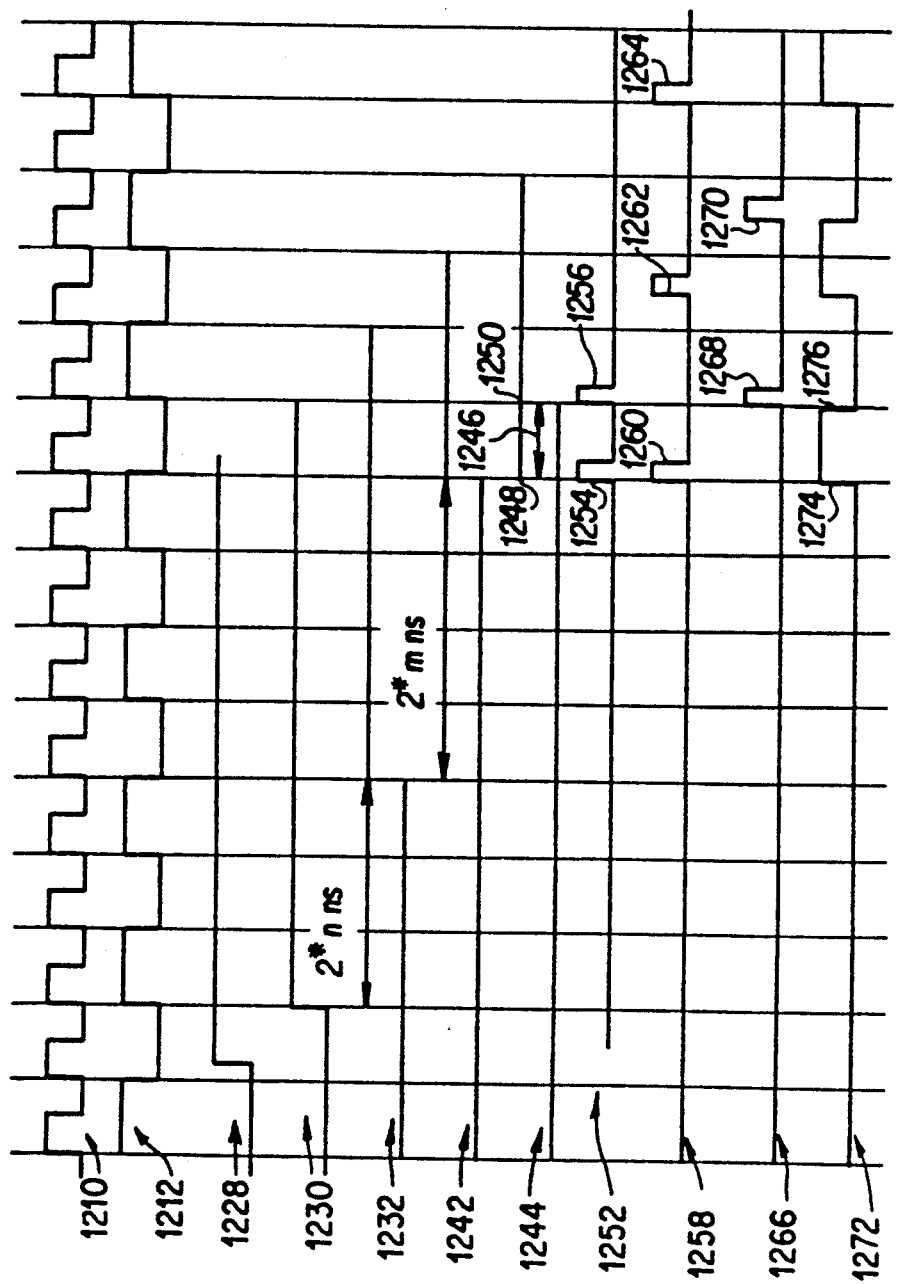

FIGS. 12A and 12B are timing diagrams showing exemplary waveforms of the described system 400. System operation will be described with reference to the 480 MHz VCO output clock signal from phase-locked loop 440, which may be controllably time-shifted relative to the 240 MHz fixed pulse-repetition frequency of the UV output pulse train from laser subsystem 404. That is, the 480 MHz clock signal 1210 (FIGS. 12A and 12B) supplied on output line 918 (FIGS. 4 and 9) is varied in time relative to the output from reference oscillator 408 (FIG. 4), while the UV laser pulse train from laser subsystem 404 is fixed with respect to the output from reference oscillator 408 (FIG. 4).

Waveform 1212 depicts the 480/2 MHz signal supplied at the output of divide-by-two circuit 914. Waveforms 1214, 1216 and 1218 respectively depict the 240 MHz repetition-rate UV laser pulses from laser subsystem 404 in sync, leading by 90°, and lagging by 90°, relative to waveform 1212. Again, it is to be noted that it is actually waveforms 1210 and 1212 which are shifted, while waveform 1214 remains fixed. Line 1220 of FIG. 12A shows the timing of a train of laser/electron-beam pulses relative to the 480/2 MHz waveform 1212: when waveform 1212 is in sync with the laser/e-beam pulse train, the laser/e-beam pulse train is as shown by the dark lines (see arrow 1222); when waveform 1212 lags the laser/e-beam pulse train by 90°, the laser/e-beam pulse train is shifted as shown by arrow 1224; and when waveform 1212 leads the laser/e-beam pulse train by 90°, the laser/e-beam pulse train is shifted as shown by arrow 1226. Otherwise stated, fine-delay phase-locked loop 440 allows clock signal 1212 to be controllably phase-shifted in vernier fashion over a range of ±180° relative to the UV laser pulse train. The vernier-shift "window" is approximately 2 ns as shown at line 1220 in FIG. 12A (1/480 MHz ≈ 2.08 ns).

An operating cycle of system 400 begins with an asynchronous enable ("start") signal (FIG. 12A, line 1228) supplied by data processing system 418 to AND gate 920 while restart line 1012 is high. The output of AND gate 920 is synchronized to clock signal 1212 by flip-flop 922, producing the sync enable signal (FIG. 12A, line 1230). The sync enable delayed signal (FIG. 12A, line 1232) on output line 942 of coarse delay counter 442 goes high at some integer number "n" of 480 MHz clock cycles after the sync enable signal (FIG. 12A, line 1230) goes high; the integer number is determined by the terminal count value loaded in coarse delay counter 442.

Hold-off counter 924 is programmed to count any integer number "y" of 120 MHz clock cycles, so that its output waveform 1234 goes high at a programmable interval of approximately 8*y ns (more precisely, 1/120 MHz ≈ 8.33) following the first rising edge of the 120 MHz clock signal after the sync enable delayed signal 1232 goes high. Beam unblank adjustable delay circuit 926 adds a further, programmable, vernier delay of "x" ns, as depicted by the waveform of line 1236. A beam unblank pulse of 3 ns width (FIG. 12A, line 1238) is produced by pulse picker 414 in response to signal 1236, to allow a single electron-beam pulse to pass through blanker 428 and into electron-beam column 426.

To summarize, FIG. 12A illustrates how a single "sync enable" event (line 1230) and a single beam-unblank pulse (line 1238) are generated at programmably-controllable times relative to the 240 MHz laser/e-beam pulse train.

Waveforms 1210, 1212, 1228, 1230 and 1232 of FIG. 12A are repeated in FIG. 12B for reference. Waveform 1232, sync enable delayed, depicts the output signal from coarse timebase delay counter 442 (on output line 942 of FIG. 9), which goes high approximately 2*n ns after sync enable waveform 1230 goes high; "n" is a terminal-count integer loaded into coarse delay counter 442 by data processing system 418.

Waveform 1242 depicts the output of an exemplary one of the 20 output lines of register/mux 1024, which goes high approximately 2* m ns after waveform 1240 goes high (more precisely, m/480 MHz≈2.08*m ns); "m" is a terminal-count integer loaded into counter/-generator 1010 by data processing system 418. Waveform 1244 is the output of the corresponding one of the 20 vernier circuits 1028, with the rising edge delayed relative to that of waveform 1242 by a programmable interval of up to one 480 MHz clock cycle (≈2.08 ns) as shown by arrow 1246. That is, the edge can go high at any time between time 1248 and 1250. Waveform 1252 shows the narrow pulse output from the corresponding one of the 20 edge-to-pulse generators 1032; if waveform 1244 went high at time 1248, then a narrow pulse 1254 is produced, and if waveform 1244 went high at time 1250, then a narrow pulse 1256 is produced.

Waveform 1258 depicts the typical output signal from a "set" array of OR gates (e.g., OR gate array 1118 of FIG. 11), comprising a series of pulses 1260, 1262, 1264, etc. It is noted that, due to the programmable nature of vernier circuits 1028, the pulses may be placed as desired relative to the 480 MHz VCO clock waveform 1210. Waveform 1272 depicts the typical output signal from a "reset" array of OR gates (e.g., OR gate array 1124 of FIG. 11), comprising a series of pulses 1268, 1270, etc. Again, due to the programmable nature of vernier circuits 1028, the pulses may be placed as desired relative to the 480 VCO clock waveform 1210. Waveform 1272 depicts the typical output signal from S/R flip-flop 1120 on output line 1126 (FIG. 11), as derived from waveforms 1258 and 1266. That is, "set" pulse 1260 causes line 1126 to go high as indicated at 1274, "reset" pulse 1268 causes line 1126 to go low at time 1276, etc.

To recap, laser subsystem 404 applies a UV output pulse train at a fixed pulse-repetition frequency of 240 MHz to photocathode assembly 430. The resultant electron beam sampling pulse train emitted by photocathode assembly 430 is then formed at 240 MHz, or is blanked by blander 428 to form an integral submultiple of this frequency (e.g., 120 MHz, 80 MHz, 60 MHz, etc.). Unblanking of blanker 428 is known as "pulse picking". Pulse picking is used where the time sweep of the sampled measurement exceeds one laser pulse repetition period.

FIGS. 12A and 12B illustrate exemplary waveforms of one sampling measurement cycle, i.e., of one electron-beam probe pulse. Sampling measurements in accordance with the present invention are performed by varying the phase of the entire test program timing (e.g., shifting the phase of the test pattern applied to the DUT) relative to the fixed electron-beam sampling pulse train. This is in contrast to the prior-art technique of fixing the test pattern timing and varying the phase of the measurement sampling pulse.

The 120 MHz signal output from reference oscillator 408 (preferably a crystal oscillator) acts as a master clock to drive the "shutter" of the laser subsystem to produce the pulsed UV laser beam, and is also used to phase lock the 480 MHz voltage-controlled oscillator 910, which may be crystal-controlled if necessary for adequate stability. Phase discriminator 902 (e.g., Analog Devices part number AD9901) runs at 120 MHz, and has good linearity. A programmable offset introduced by phase-locked loop 440 forces a phase shift of up to ±45° at 120 MHz (one cycle at 480 MHz, or ≈2.08 ns) in the clock signal which drives coarse delay counter 442 and test pattern generator 416. Coarse-delay counter 442 is programmable to delay the start of the test pattern sequence by any desired number of 480 MHz clock cycles. The programmable, supplemental (fine) delay introduced by phase-locked loop 440 allows control to ≈1 ps resolution.

To effect time-base autocalibration, a GaAs D-type flip-flop 938 (e.g., Gigabit Logic part number 10G021A) is used to detect coincidence between the shifted 480 MHz clock signal on line 918 (FIG. 9) and the 120 MHz reference signal from oscillator 408, to determine the ±45° points. Non-linearity of 1% in the vernier phase shifter (fine-delay phase-locked loop 440) can cause up to 20 ps timebase error between vernier end points. This non-linearity can be characterized by, and a correction look up table created in, data processing system 418. Alternatively, a voltage-controlled phase shifter could be put in the 120 MHz signal path from reference oscillator to phase comparator 902.

It is expected that the phase-lock scheme should provide sufficiently low jitter. There is a trade off between jitter and the speed with which the phase changing can be done. Every ≈2.08 ns along the time base, the phase of the 480 MHz oscillator has to change 360°. With a voltage controlled crystal oscillator this could take many ms. Also, even the phase changes for the timebase steps within the vernier range could take up to 1 ms to stabilize. Good jitter performance might be obtained with a non-crystal VCO but, if performance is to be improved, a crystal VCO may be used.

In general, the use of GaAs devices is avoided as far as possible in positions where there are duty cycle variations, as this technology is known to suffer from pattern-dependent propagation delays which could cause calibration errors. However GaAs devices are preferred for use as pin drivers 448. Simulations of GaAs driver circuits have shown that rise/fall times of 80 ps can be obtained, switching 20 mA into 50 ohms. However, packaging appears to be critical. It is preferred to use a GaAs integrated circuit or discrete components on an alumina substrate. The hybrid may be either leadless with all connections done by a Tektronix Hypcon elastomer connector to a printed circuit board or an SMA-type connector could contact the fast output directly on the hybrid.

Figure 13:
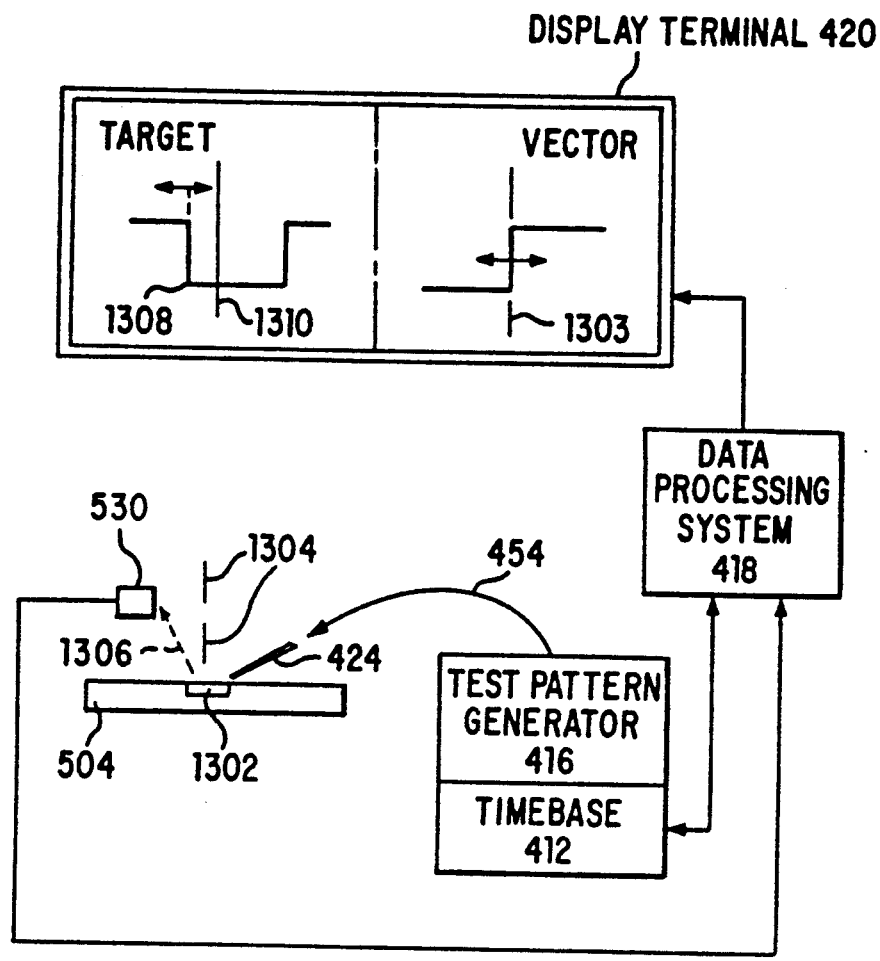
FIG. 13 is a simplified illustration of how the invention may be employed in analyzing an electronic circuit.

FIG. 13 is a simplified illustration of how the present invention may be employed in analyzing an electronic circuit. A test-vector pattern is applied by generator 416 to a target element 1302 of a wafer 504. The test vector pattern is synchronized to a timing reference 1303, as depicted in the "vector" window of display terminal 420. Electron beam pulses 1304 are applied to target element 1302, and secondary electrons 1306 are detected to supply a probe signal to data processing system 418. An event of probe signal (such as an edge 1308) may be related to a timing reference 1310, as shown in the "target" window of display terminal 420. The probe signal event may be aligned with the timing reference by adjusting the test vector pattern relative to timing reference 1303. Such adjustment may, for example, be made by displaying the signals as illustrated, and then giving commands to the data processing system 418 by keyboard or mouse pointer or the like. The electron-beam probe may be directed to element 1302 with the aid of "navigational" tools (employing CAD data, NET list data, schematic data, etc.) and the results displayed using "display" tools as described in U.S. Pat. No. 4,706,019 and/or as embodied in the IDS 5000 TM electron beam test probe system.

Variations of the above-described system are possible. For example, it may be desired to compensate for the possibility that the average UV power output of laser subsystem 404 may vary significantly (by as much as a factor of two or more), and/or noise on the UV output may be significant (as much as 10% or more). Such changes in laser power output become more important as the primary electron beam current is increased, since with higher primary electron beam current less signal averaging is done and therefore laser noise is not averaged out as much. The effect of slow changes of laser power (drift) and rapid changes of laser power (noise) on the recovered signal waveform can be reduced with a signal recovery scheme shown in FIG. 14. An amplifier 1410, a resistor 1415, and an integrator comprised of resistor 1420, amplifier 1425 and capacitor 1430, are connected to electron detector 530 and to energy analyzer electrode 528 to form a negative feedback loop. A controllable switch 1432 is provided between amplifier 1410 and resistor 1420 for gating the input signal to the integrator.

Figure 14:
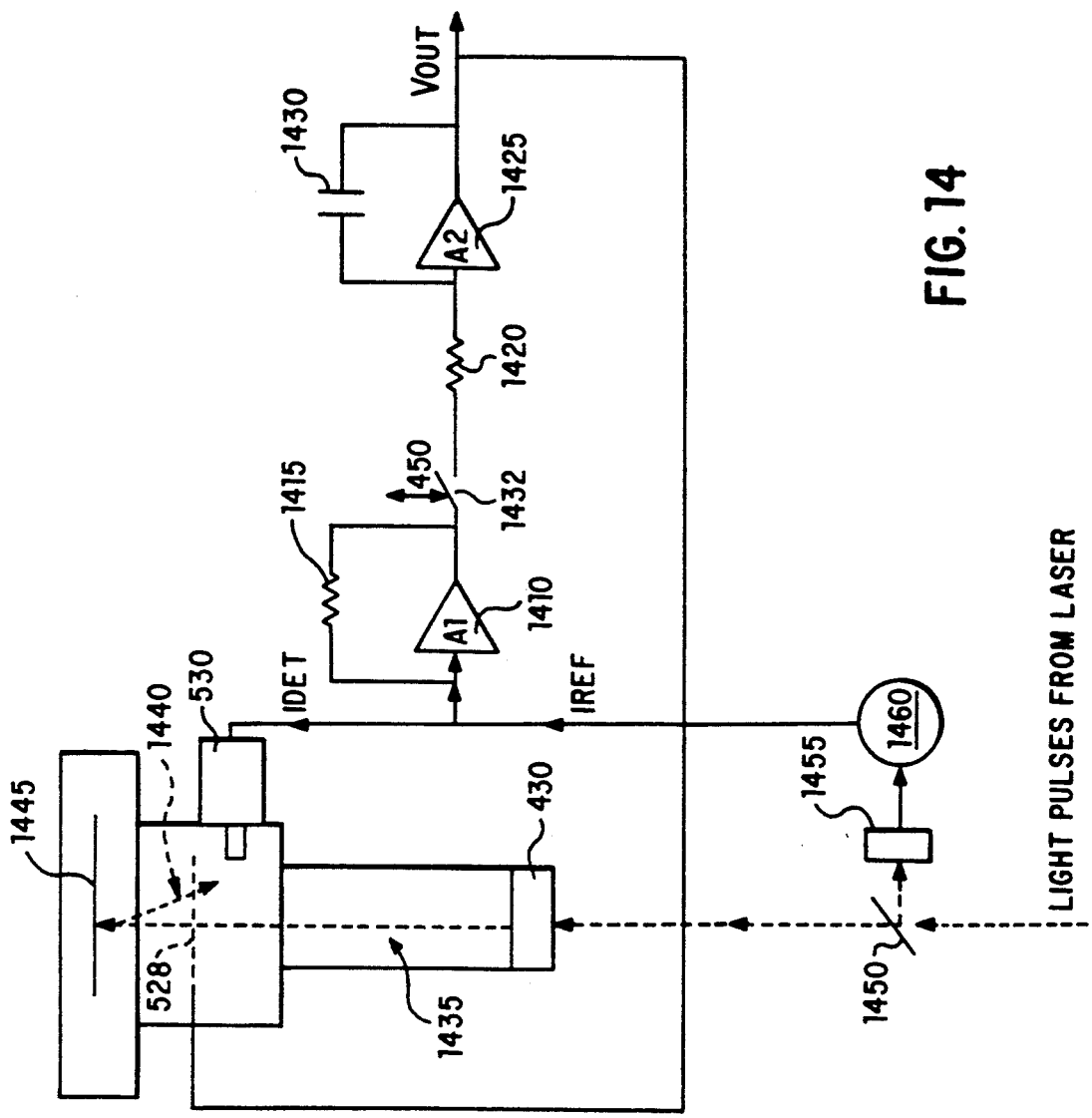
FIG. 14 illustrates schematically a signal recovery scheme in accordance with the invention for reducing the effect of laser power drift and noise on the recovered signal waveform.

Operation of the negative feedback loop of FIG. 14 can be understood by first assuming that switch 1432 is closed and the primary electron beam 1435 is continuous. Then if the current Idet produced by electron detector 530 (from detection of secondary electrons 1440 from target 1445) is greater than a reference current Iref derived from the light pulses supplied to stimulate photocathode assembly 430, the integrator output voltage Vout goes negative, reducing the flow of secondary electrons through energy analyzer electrode 528 and thus reducing the signal from electron detector 530 until it equals the reference current Iref. In operation, however, the primary electron beam 1435 consists of pulses of electrons. Switch 1432 is therefore closed only when secondary electrons 1440 are entering the detector (e.g., from the target 1445). For this purpose, operation of switch 1432 is suitably controlled, e.g., by data processing system 418 via data lines 450. The voltage waveform applied to energy analyzer electrode 528 (Vout) is a good approximation of the voltage waveform on target 1445.

Reference current Iref can be produced by using a mirror 1450 to divert a portion of the light pulses from laser subsystem 404 to a detector 1455, the output of which controls the output current (Iref) from a current source 1460. The response time of the control can be made short enough to resolve the laser noise which is in the range of DC to 200 kHz. With the scheme of FIG. 14, variation of primary electron beam power due to variation in laser subsystem power output will cause the secondary electron detector current Idet and the reference current Iref to change by equal proportions. Once the feedback loop has settled so that the electron detector signal Idet is equal to the reference current Iref, any increase or decrease in laser power will not change this equality. The detected voltage Vout will thus be unaffected by laser power changes.

It will also be recognized that methods other than as described above may be employed for shifting the time relationship of the test pattern relative to the selected laser pulses. For example, the 480 MHz clock signal (on line 918, FIG. 4) which is used to clock the pattern generator may be derived from the 120 MHz drive signal supplied by phase stabilizer 410 to mode locker 434 with a technique known as direct digital synthesis. With this technique, a sine wave is reconstructed from the output of a digital-to-analog converter (DAC) driven from a read-only memory (ROM) containing a sine wave table. A sine wave signal is produced by sequencing through the ROM addresses. The phase of the output sine wave can be changed relative to the address clock by adding to the address code a number representing the desired phase offset. The direct digital synthesis technique provides a clock signal having low jitter, and the amount of phase shift is determined digitally so calibration is not required.

Figure 15:
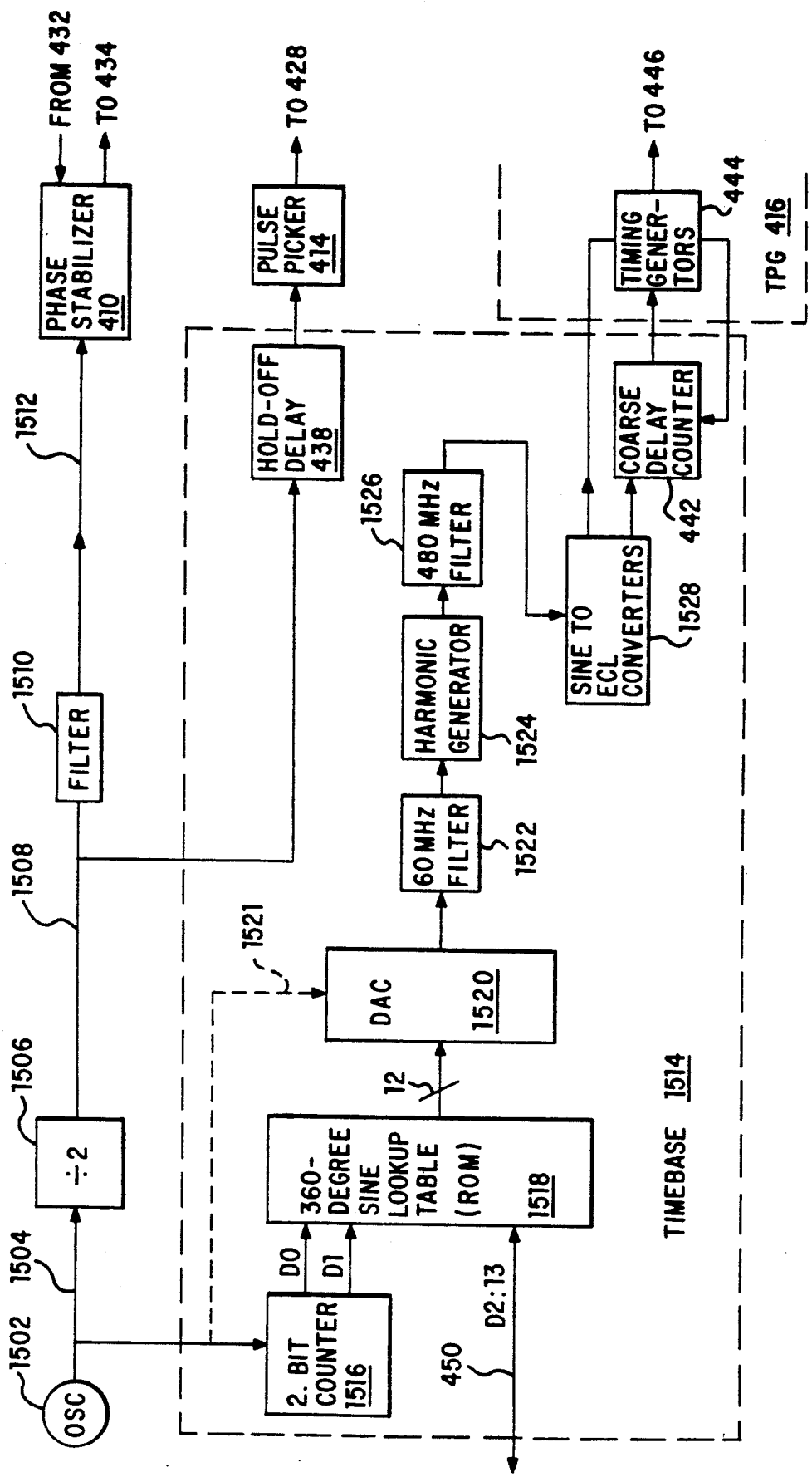
FIG. 15 illustrates a modification of the system of FIG. 4 in which direct digital synthesis of reference signals is employed.

FIG. 15 illustrates an example of how the system of FIG. 4 may be modified to employ direct digital synthesis. Like elements are shown with like reference numerals in FIGS. 4 and 15. Reference crystal oscillator of FIG. 4 is replaced with a reference oscillator 1502 which supplies a 240 MHz reference signal on its output line 1504. The 240 MHz reference signal on line 1504 is divided by two in a divider circuit 1506 which supplies a 120 MHz ECL-clock signal on line 1508 to a 120 MHz narrow-band filter 1510. The 120 MHz sine-wave signal required by laser subsystem 404 is supplied at output line 1512 of filter 1510 to phase stabilizer 410. The 120 MHz ECL-clock signal on line 1508 is also supplied to hold-off delay 438.

In the embodiment of FIG. 15, a timebase circuit 1514 is substituted for timebase circuit 412 of FIG. 4. The 240 MHz reference signal from oscillator 1502 clocks a 2-bit counter 1516 which drives the two most-significant bits of a 360-degree sine look-up table stored in a ROM 1518. The address on lines D0 and D1 of ROM 1518, representing phase, completes a cycle every four clocks. Each phase address presented to the look-up table gives an output from ROM 1518 representing the amplitude of a sine wave at that phase. The outputs from ROM 1518 are converted by a DAC 1520 into a quantized 60 MHz sine wave whose wave shape is improved by a 60 MHz narrow band filter 1522. DAC 1520 may optionally receive the 240 MHz signal from oscillator 1502 via line 1504 and 1521 as needed for clocking purposes. The 60 MHz wave from filter 1522 drives a harmonic generator 1524. A 480 MHz narrow-band filter 1526 passes the eighth harmonic of the phase-controlled output signal from filter 1522 to sine-to-ECL converters 1528 which drive coarse delay counter 442 and timing generators 444. The fine phase control of the 60 MHz wave relative to the 240 MHz clock signal can be obtained by altering the least significant bits addressing the sine look-up table on digital phase-control input lines D2:13 of ROM 1518. Phase-control input lines D2:13 of ROM 1518 are preferably data lines of bus 450, so that the fine phase control of the 60 MHz signal is controlled by data processing system 418.

In the embodiment of FIG. 15, the two most significant bits (on data input lines D0 and D1 of ROM 1518) are controlled by two-bit counter 1516, leaving essentially one quarter of the complete 360 degrees of phase adjustment (controlled by the data on input lines D2:13 of ROM 1518) available for fine phase-control. A 90-degree adjustment at 60 MHz will be 720 degrees at 480 MHz, or two complete cycles. The system requires only 360 degrees of phase adjustment at 480 MHz to achieve fine-delay of zero to 2.08 ns.

Figure 16:
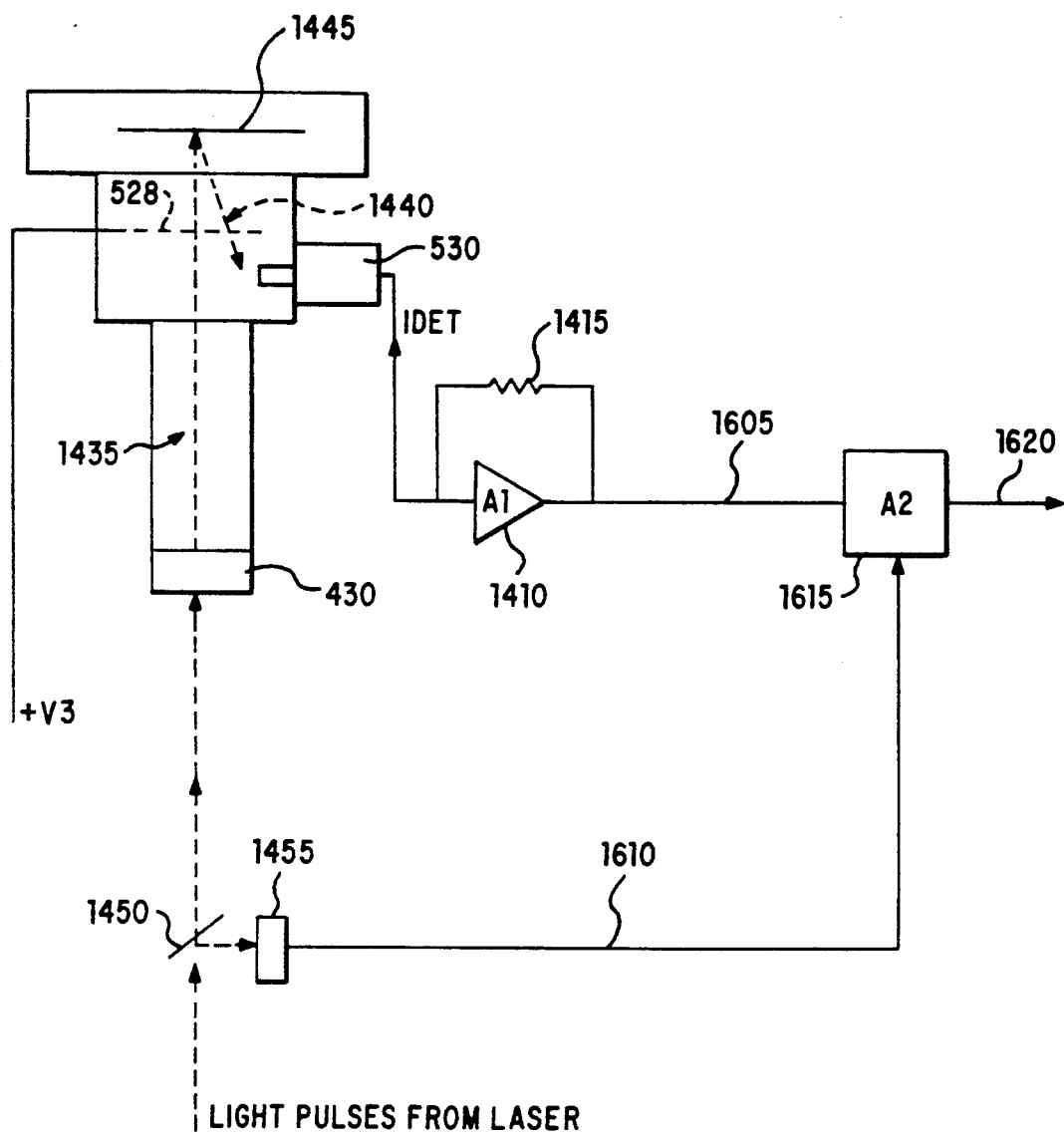
FIGS. 16 and 17 illustrate modifications of the system in accordance with the invention for improving image quality when the system is operated in scanning electron microscope mode.
Figure 17:
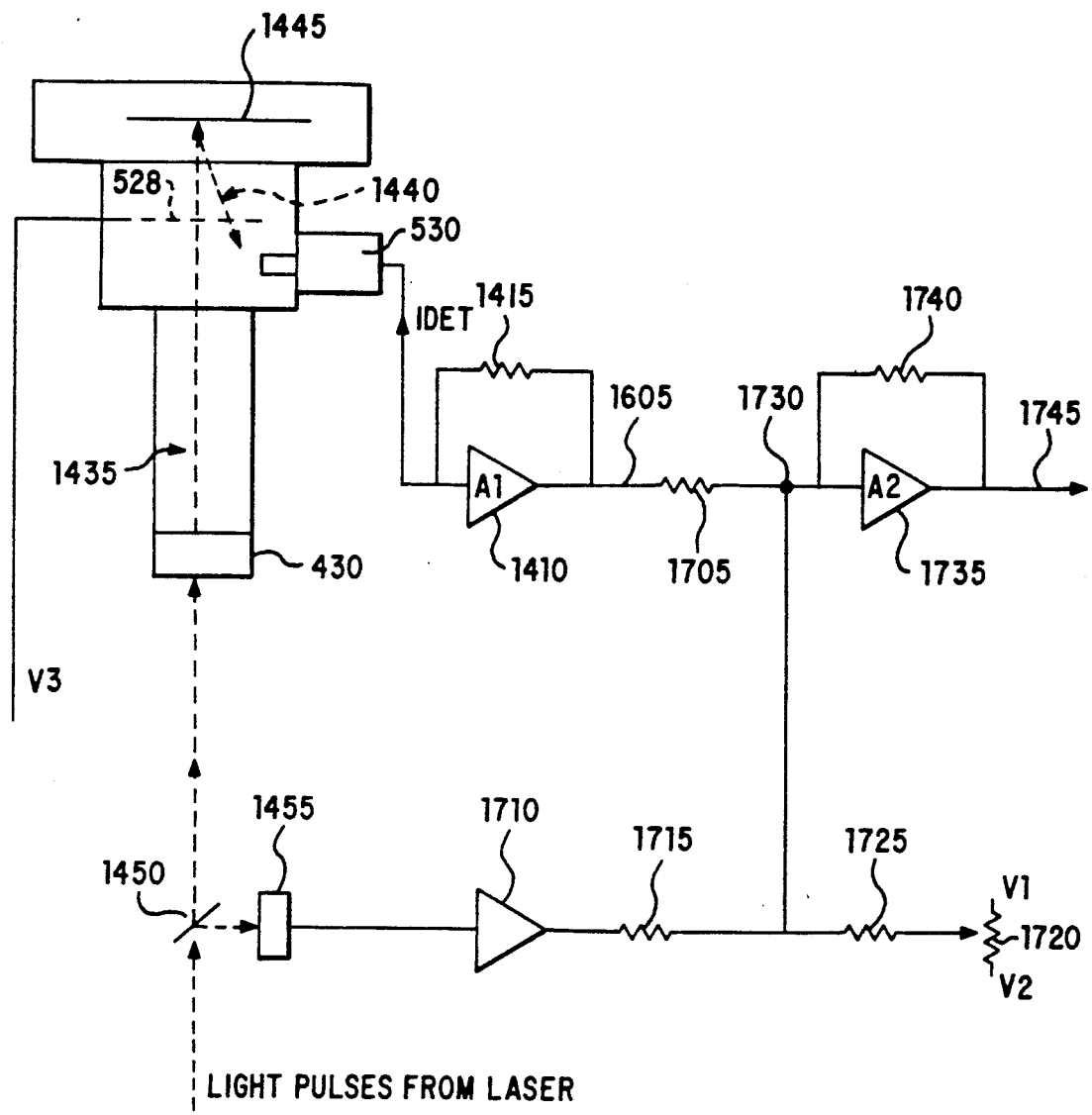

Other modifications of the system are also possible. It has been found that rapid variations in laser output power over the range of +/−5% can result in poor video image quality when the laser-stimulated photocathode system is operated in the scanning electron microscope mode. These variations can cause flickering of the image. FIGS. 16 and 17 illustrate modifications of the foregoing embodiments which can be employed to improve the image quality. Like elements are indicated by like reference numerals.

FIG. 16 shows that in image mode, mesh 528 is at a positive potential V3 such that all secondary electrons 1440 pass through it and reach detector 530. Detector 530 produces a current Idet proportional to the secondary electron emission. The primary electron beam 1435 is scanned over the target sample 1445. Amplifier 1410 together with resistor 1415 convert the current from detector 530 into a voltage on line 1605 which can be used as the video signal to produce the image on a television-style display, e.g., of display terminal 420. However, as the emission of electrons from the photocathode is proportional to laser power output, the video signal at the output of amplifier 1410 will change in amplitude with changes in laser power.

As shown in FIG. 16, mirror 1450 diverts a portion of the light pulses from laser subsystem 404 to laser-power monitoring detector 1455. The output of detector 1455 on line 1610 controls the gain of a gain-controlled element 1615, which can be an attenuator or amplifier. The video signal at output line 1620 of gain-controlled element 1615 is thus unaffected by laser power changes. A further arrangement for compensating the video image signal for changes in laser power is shown in FIG. 17. Again, mesh 528 is at a positive potential V3 such that all secondary electrons 1440 pass through it and reach detector 530. Detector 530 produces a current Idet proportional to the secondary electron emission. The primary electron beam 1435 is scanned over the target sample 1445. Amplifier 1410 together with resistor 1415 convert the current from detector 530 into a voltage on line 1605 which is supplied to a resistor 1705. Mirror 1405 diverts a portion of the laser pulses to laser-power monitoring detector 1455. The output of detector 1455 is supplied to amplifier 1710, the output of which is passed to a resistor 1715. A potentiometer 1720 is connected to voltage sources V1 and V2 as shown, and the adjustable tap of potentiometer 1720 is connected to a resistor 1725. An operational amplifier 1735 sums the output of amplifier 1410 from resistor 1705, the output of amplifier 1710 from resistor 1715, and the output of potentiometer 1720 from resistor 1725. The video signal is provided on output line 1745 of operational amplifier 1735. Potentiometer 1720 can be adjusted to set the overall image brightness. For a low-contrast image, a value of resistor 1715 can be found which gives good compensation for laser power changes. For a high-contrast image, the value of resistor 1715 is chosen to give good compensation on the brightest parts of the image.

Photocathode element 804 can comprise a transparent, quartz element 880, optically polished on both faces to transmit UV laser light with minimum distortion, with a layer of calcium fluoride 882 deposited on its upper surface and with a layer of gold 884 deposited over the calcium fluoride layer. The quartz element can be either a flat disk with a focusing lens between it and the laser source (as illustrated in FIG. 8), or can be a plano-convex lens which can eliminate the need for lens 802. An anti-reflection coating may optionally be applied for improved coupling efficiency. Seven hundred Angstroms of calcium fluoride is deposited on the active (flat) face of the quartz element to roughen the surface. A uniform film of gold, approximately 100–200 Angstroms thick, is then evaporated onto the active face of the quartz element.

Alternate embodiments of photocathode element 804 are also within the scope of the invention. For example, a film of platinum has been used in place of the gold film and has been found to work well at a uniform coating of approximately 100 Angstroms in thickness. As quality control of the film thickness has been found to be difficult, the film may alternately be deposited in some non-uniform pattern (for example; varying across the quartz element in a linear or radial pattern) which varies between a thickness of, for example, 50 to 250 Angstroms. The pattern and thickness are determined by the mask and evaporation scheme selected, in accordance with techniques well-known to those of skill in the art. A variable-thickness pattern can be achieved by tilting the quartz element relative to a wire source when depositing the film, for example. With a variable-thickness film on photocathode element 804, the photocathode assembly can be "tuned" by turning screws 830 to laterally displace carrier ring 816 and thereby position photocathode element 804 such that a region of optimum film thickness lies in the path of the laser beam pulses (see FIG. 8).

The foregoing description of preferred embodiments of the invention is intended as illustrative only, and not as a limitation of the invention as defined by the claims which follow. Those of skill in the art will recognize many modifications which may be made in the preferred embodiments within the spirit and scope of the claimed invention.

As used herein, an "electronic circuit" is intended to mean an integrated circuit, a hybrid circuit, an optoelectronic circuit, a multi-chip carrier module (MCM), or any other manufactured item having active and/or inactive elements and/or conductors which may be probed with an electron-beam test probe.

We claim:

1. An electron-beam test probe system for analyzing an electronic circuit, said analysis including the measurement of the potential at selected points on said electronic circuit, said electron-beam test probe system comprising:

a. a test probe (402) comprising a photocathode (430, 804) for generating a pulsed electron beam in response to laser beam pulses, means (426) for applying said pulsed electron beam to an electronic circuit, and means (530) for measuring potential at a selected point within said electronic circuit by detecting secondary electrons;

b. a laser generating subsystem (404) for generating a pulsed laser beam having a stabilized repetition frequency;

c. an optical coupler (452) for coupling said pulsed laser beam to said photocathode to generate a pulsed electron beam;

d. a test pattern generator (416) responsive to a timebase circuit for generating a formatted test pattern which is synchronized to said stabilized repetition frequency;

e. transmission lines (454) for supplying said formatted test pattern to an electronic circuit to be analyzed; and f. a timebase circuit (412) synchronized with said laser subsystem and coupled to said pattern generator for inserting a programmable phase delay between said pulsed laser beam and said formatted test pattern.

2. The electron-beam test probe system of claim 1, wherein said test probe (402) includes means (616) for scanning said pulsed electron beam over a region of said electronic circuit, and wherein said system further comprises means (418, 420) responsive to said potential measuring means for generating an image of potentials on surfaces within said electronic circuit.

3. The electron-beam test probe system of claim 2, wherein said means for measuring potential at a selected point within said electronic circuit by detecting secondary electrons comprises:

i. an electron detector 530 for detecting secondary electrons and producing a corresponding electron detector signal (Idet);

ii. a control signal source (1455) responsive to said pulsed laser beam for producing a gain control signal dependent upon power output of said laser generating subsystem; and iii. a gain-controlled element (1615) responsive to said electron detector signal for producing a measured-potential signal representing voltage at points on said electronic circuit as said pulsed electron beam is scanned over a region of said electronic circuit, wherein gain of said gain-controlled element is controlled by said control signal such that said measured-potential signal is dependent upon said electron detector signal and is compensated for variation in power output of said laser generating subsystem.

4. The electron-beam test probe system of claim 3, wherein said control signal source comprises a light-pulse detector (1455) responsive to said pulsed laser beam.

5. The electron-beam test probe system of claim 2, wherein said means for measuring potential at a selected point within said electronic circuit by detecting secondary electrons comprises:

i. an electron detector (530) for detecting secondary electrons and producing a corresponding electron detector signal (Idet);

ii. a reference signal source (1455) responsive to said pulsed laser beam for producing a reference signal dependent upon power output of said laser generating subsystem;

iii. a circuit (1410, 1710, 1735) responsive to said electron detector signal and to said reference signal for producing a measured-potential signal representing voltage at points on said electronic circuit as said pulsed electron beam is scanned over a region of said electronic circuit, wherein said measured-potential signal is dependent upon said electron detector signal and is compensated for variation in power output of said laser generating subsystem.

6. The electron-beam test probe system of claim 2, wherein said means for measuring potential at a selected point within said electronic circuit by detecting secondary electrons comprises:

i. an electron detector (530) for detecting secondary electrons and producing a corresponding electron detector current signal (Idet);

ii. an amplifier (1410) responsive to said electron detector current signal for producing a corresponding electron detector voltage signal;

iii. a reference signal source (1455, 1710) responsive to said pulsed laser beam for producing a reference signal dependent upon power output of said laser generating subsystem; and iv. an amplifier (1735) responsive to a sum of said electron detector voltage signal and said reference signal for producing a measured-potential signal dependent upon said electron detector signal and compensated for variation in power output of said laser generating subsystem, and wherein said means for generating an image of potentials on surface within said electronic circuit is responsive to said measured-potential signal.

7. The electron-beam test probe system of claim 6, wherein said means for measuring potential at a selected point within said electronic circuit by detecting secondary electrons further comprises means (1720) for applying an adjustable bias voltage to said sum of the electron detector voltage signal and the reference signal.

8. The electron-beam test probe system of claim 1, wherein said pulsed electron beam has a pulse repetition rate equal to said stabilized repetition frequency, wherein said test probe comprises controllable blanker (428) for gating the pulses of said pulsed electron beam, and wherein said system further comprises a pulse picker circuit (414) for controlling said blanker to reduce the electron beam pulse repetition rate to a submultiple of said stabilized repetition frequency.

9. The electron-beam test probe system of claim 1, wherein said laser generating subsystem comprises:

a mode-locked source (702) for generating a coherent beam of IR (infra-red) light;

a first frequency-doubler (728) to convert the coherent beam of IR light to a coherent beam of green light; and a second frequency-doubler (734) to convert the coherent beam of green light to a coherent beam of UV (ultra-violet) light.

10. The electron-beam test probe system of claim 9, further comprising an electronic phase stabilizer (410) coupled to said laser generating subsystem for reducing phase noise of the pulsed laser beam.

11. The electron-beam test probe system of claim 9, wherein said second frequency-doubler (734) is mounted on said test probe (402), and wherein said laser subsystem further comprises means (730, 732) for conveying said coherent beam of green light to said second frequency-doubler.

12. The electron-beam test probe system of claim 9, wherein said first frequency-doubler (728) and said second frequency-doubler (734) are mounted on said test probe subsystem (402), the laser generating means further comprising means (730, 732) for conveying said coherent beam of IR light to said first frequency-doubler (728).

13. The electron-beam test probe system of claim 1, wherein said optical coupler comprises an optical conduit (452) and a quartz lens (802) for focusing said pulsed laser beam on said photocathode (804).

14. The electron-beam test probe system of claim 13, wherein said optical conduit (452) comprises an optical fiber, and a lens (742) for coupling said pulsed laser beam into said optical fiber.

15. The electron-beam test probe system of claim 13, wherein said optical conduit (452) comprises an articulated light pipe providing substantially free movement in multiple axes between said beam laser beam generating subsystem and said photocathode.

16. The electron-beam test probe system of claim 1, wherein said photocathode (804) comprises:
    a polished quartz substrate (880);
    a layer (882) of calcium fluoride deposited on a face of said polished quartz substrate; and
    a gold film (884) deposited on said layer of calcium fluoride.

17. The electron-beam test probe system of claim 16, wherein said test probe (402) comprises an evacuated electron-beam column (426) having an opening for receiving said photocathode (804), said photocathode being received in said opening, and further comprising means (828) for hermetically sealing said photocathode in said opening.

18. The electron beam test probe system of claim 17, further comprising means (830) for positioning said quartz substrate so that said pulsed laser beam may be selectively applied to any point within a region of said photocathode so as to renew said photocathode, and wherein said means (828) for hermetically sealing is adapted to permit such movement without loss of hermetic seal.

19. The electron beam test probe system of claim 16, further comprising means (830) for positioning said quartz substrate so that said pulsed laser beam may be selectively applied to any point within a region of said photocathode so as to renew said photocathode.

20. The electron-beam test probe system of claim 1, further comprising means (832, 834, 826) for maintaining said photocathode at a high negative potential relative to ground.

21. The electron-beam test probe system of claim 20, wherein said test probe means (402) comprises an anode (806) maintained at a high positive potential relative to ground.

22. The electron-beam test probe system of claim 1, wherein said test pattern generator (416) comprises:
    a circuit (444) for generating a set of timing event signals having timing events in controlled timing relationships to a reference clock signal and to one another;
    a logic array (1114, 1118, 1124) for selectively transforming at least some of said timing event signals into a pattern of "set" and "reset" signals;
    at least one circuit (1120) for forming said formatted test pattern from said pattern of "set" and "reset" signals; and
    means (1128) for driving the electronic circuit to be analyzed with said formatted test pattern.

23. The electron-beam test probe system of claim 22, wherein said circuit (444) for generating a set of timing event signals having timing events in controlled timing relationships to one another includes programmable vernier delay elements (1028) for controlling said timing relationships.

24. The electron-beam test probe system of claim 1, wherein said timebase circuit (412) comprises:
    a phase-locked voltage-controlled oscillator (910) synchronized with said laser subsystem (404), said oscillator supplying to said test pattern generator a reference clock signal (1210) having its phase dependent on a reference voltage supplied to the oscillator;
    means (906, 904) for supplying a programmable reference voltage to said oscillator to effect control of the phase of said reference clock signal; and a programmable counter (442) to count cycles of said reference clock signal supplied to said test pattern generator, said programmable counter providing a synchronization signal (1232) to said test pattern generator.

25. The electron-beam test probe system of claim 1, wherein said transmission lines (454) comprise at least one controlled impedance transmission line and least one high-bandwidth, co-planar transmission line probe (424).

26. The electron-beam test probe system of claim 1, wherein said test probe (402) comprises means (530, 528) for detecting and analyzing the energy of secondary electrons and for providing a corresponding measurement signal, and wherein said test probe system further comprises a data processing system (418, 420) connected to receive, to process and to graphically display said measurement signal.

27. The electron-beam test probe system of claim 26, wherein said test probe (402) further comprises means (616) for aiming said electron beam at said selected point within said electronic circuit with reference to design data of said electronic circuit.

28. The electron-beam test probe system of claim 1, wherein said photocathode (804) comprises:
    a polished quartz substrate (880);
    a layer (882) of calcium fluroide deposited on a face of said polished quartz substrate; and
    a metal film (884) deposited on said layer of calcium fluoride.

29. The electron-beam test probe system of claim 28, wherein said metal film is a film of platinum.

30. The electron-beam test probe system of claim 28, wherein said metal film is deposited on said layer of calcium fluoride in a pattern of variable thickness, and wherein said test probe further comprises means (830) for adjusting position of said photocathode such that a selected region said metal film lies in the path of the laser beam pulses.

31. The electron-beam test probe system of claim 1, wherein said means for measuring potential at a selected point within said electronic circuit by detecting secondary electrons comprises:
    i. an electron detector 530 for detecting secondary electrons and producing a corresponding electron detector signal (Idet);
    ii. an energy analyzer electrode (528) situated between said electronic circuit and the electron detector;
    iii. a reference signal source (1455, 1460) responsive to said pulsed laser beam for producing a reference signal (Iref) dependent upon power output of said laser generating subsystem; and
    iv. a gated integrator circuit (1410–1435) responsive to said detector signal (Idet) and said reference signal (Iref) for producing a voltage output signal (Vout) representative of potential at a point within said electronic circuit, said voltage output signal being applied to said energy analyzer electrode so that variations in power output of said laser generating subsystem are compensated by variations in said voltage output signal.

32. The electron-beam test probe system of claim 31, wherein said electron detector signal (Idet) comprises a current signal, wherein said reference signal source comprises a variable-current source (1460) for producing said reference signal (Iref) and a light-pulse detector (1455) responsive to said pulsed laser beam for controlling said variable-current source, and wherein said gated integrator circuit comprises an amplifier (1410) for producing a integrator signal representative of a difference between current levels of said detector signal (Idet) and said reference signal (Iref), an integrator (1425, 1430) for producing said voltage output signal (Vout), and a controllable gate (1435) for supplying said integrator signal to said integrator.

33. The electron-beam test probe system of claim 32, wherein said reference signal source further comprises a mirror (1450) for diverting a portion of light pulses from said pulsed laser beam to said light-pulse detector (1455).

34. The electron-beam test probe system of claim 1, wherein said timebase circuit comprises:
  i. a digital circuit (1516, 1518) driven in synchronism with said laser subsystem for synthesizing a digital sine wave signal, said digital circuit being responsive to a digital phase-control signal for shifting phase of said digital sine wave signal; and
  ii. circuitry (1520–1528) for producing from said digital sine wave signal a reference clock signal (1210) and supplying said reference clock signal to said test pattern generator.

35. The electron-beam test probe system of claim 1, wherein said timebase circuit comprises:
  i. a counter (1516) driven in synchronism with said laser subsystem for producing a repetitive digital address signal sequence representing sine wave phase;
  ii. a memory (1518) containing a stored table of sine wave values and having a first set of address lines responsive to said digital address signal sequence for producing a digital sine wave signal and a second set of address lines responsive to a digital phase-control signal for shifting phase of said digital sine wave signal;
  iii. a digital-to-analog converter (1520) for converting said digital sine wave signal to an analog sine wave signal;
  iv. a harmonic generator (1524) for generating harmonics of said analog sine wave signal;
  v. circuitry (1526, 1528) for producing from one of said harmonics a reference clock signal (1210) and supplying said reference clock signal to said test pattern generator.

36. A method of probing an integrated circuit with a pulsed electron beam such that a desired timing relationship is established between (i) an event occurring within the integrated circuit in response to an applied test vector pattern and (ii) a pulsed electron beam used to probe the integrated circuit, comprising the steps of:
  a. generating a reference oscillator signal;
  b. generating a timebase reference clock signal (1210) synchronized with said reference oscillator signal and having an adjustable phase relationship with respect to said reference oscillator signal;
  c. generating a repetitive test vector pattern synchronized with said timebase reference clock signal;
  d. exercising said integrated circuit by applying said test vector pattern to said integrated circuit;
  e. generating a pulsed laser beam synchronized with said reference oscillator signal and having a stabilized repetition frequency;
  f. applying said pulsed laser beam to a photocathode to generate a pulsed electron beam synchronized with said reference oscillator signal;
  g. probing said integrated circuit by directing said pulsed electron beam at said integrated circuit and detecting secondary electrons emitted from said integrated circuit to produce an output signal representative of an event (1308) within said integrated circuit relative to a timing reference (1310) synchronized with said reference oscillator signal; and
  h. adjusting the phase relationship of said timebase reference signal with respect to said reference oscillator signal, such that said event within said integrated circuit is adjusted in time relative to said timing reference.

* * * * *